(12) United States Patent
Wu et al.

(10) Patent No.: US 12,057,485 B2
(45) Date of Patent: Aug. 6, 2024

(54) GATE-ALL-AROUND (GAA) METHOD AND DEVICES

(71) Applicant: Taiwan Semiconductor Manufacturing Co., Ltd., Hsinchu (TW)

(72) Inventors: Shien-Yang Wu, Jhudong Town (TW); Ta-Chun Lin, Hsinchu (TW); Kuo-Hua Pan, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 154 days.

(21) Appl. No.: 17/409,086

(22) Filed: Aug. 23, 2021

(65) Prior Publication Data

US 2021/0384311 A1    Dec. 9, 2021

Related U.S. Application Data

(62) Division of application No. 16/409,386, filed on May 10, 2019, now Pat. No. 11,101,359.

(Continued)

(51) Int. Cl.
*H01L 29/423* (2006.01)
*H01L 21/02* (2006.01)
(Continued)

(52) U.S. Cl.
CPC .. *H01L 29/42392* (2013.01); *H01L 21/02529* (2013.01); *H01L 21/02532* (2013.01); *H01L 21/30604* (2013.01); *H01L 21/3065* (2013.01); *H01L 21/76224* (2013.01); *H01L 21/823418* (2013.01); *H01L 21/823431* (2013.01); *H01L 21/823437* (2013.01); *H01L 21/823462* (2013.01); *H01L 21/823481* (2013.01); *H01L 27/0886* (2013.01); *H01L 29/0673* (2013.01); *H01L 29/165* (2013.01); *H01L 29/401* (2013.01); *H01L 29/6653* (2013.01);
(Continued)

(58) Field of Classification Search
CPC .......... H01L 29/42392; H01L 27/0886; H01L 27/0924
See application file for complete search history.

(56) References Cited

U.S. PATENT DOCUMENTS 6,624,450 B1    9/2003  Yamazaki et al.
9,209,247 B2   12/2015  Colinge et al.
(Continued)

FOREIGN PATENT DOCUMENTS

CN    106298472 A    1/2017
CN    107978630 A    5/2018
(Continued)

*Primary Examiner* — Michele Fan
(74) *Attorney, Agent, or Firm* — Slater Matsil, LLP

(57) ABSTRACT

A method of manufacturing a device includes forming a plurality of stacks of alternating layers on a substrate, constructing a plurality of nanosheets from the plurality of stacks of alternating layers, and forming a plurality of gate dielectrics over the plurality of nanosheets, respectively. The method allows for the modulation of nanosheet width, thickness, spacing, and stack number and can be employed on single substrates. This design flexibility provides for design optimization over a wide tuning range of circuit performance and power usage.

18 Claims, 48 Drawing Sheets

Related U.S. Application Data

(60) Provisional application No. 62/772,387, filed on Nov. 28, 2018.

(51) Int. Cl.

| | | |
|---|---|---|
| *H01L 21/306* | (2006.01) | |
| *H01L 21/3065* | (2006.01) | |
| *H01L 21/762* | (2006.01) | |
| *H01L 21/8234* | (2006.01) | |
| *H01L 27/088* | (2006.01) | |
| *H01L 29/06* | (2006.01) | |
| *H01L 29/165* | (2006.01) | |
| *H01L 29/40* | (2006.01) | |
| *H01L 29/66* | (2006.01) | |
| *H01L 21/027* | (2006.01) | |

(52) U.S. Cl.
CPC .. *H01L 29/66545* (2013.01); *H01L 29/66553* (2013.01); *H01L 21/02164* (2013.01); *H01L 21/02167* (2013.01); *H01L 21/0217* (2013.01); *H01L 21/02236* (2013.01); *H01L 21/02255* (2013.01); *H01L 21/0274* (2013.01)

(56) References Cited

U.S. PATENT DOCUMENTS

| | | |
|---|---|---|
| 9,224,833 B2 | 12/2015 | Chen et al. |
| 9,251,888 B1 | 2/2016 | Liaw |
| 9,576,856 B2 | 2/2017 | Zang et al. |
| 9,853,114 B1 | 12/2017 | Rodder et al. |
| 9,935,014 B1 | 4/2018 | Cheng et al. |
| 9,991,352 B1 | 6/2018 | Frougier et al. |
| 10,014,390 B1 | 7/2018 | Bouche et al. |
| 10,032,627 B2 | 7/2018 | Lee et al. |
| 10,236,362 B2 | 3/2019 | Seo |
| 11,145,762 B2 | 10/2021 | Wei et al. |
| 2015/0048442 A1 | 2/2015 | Colinge et al. |
| 2015/0221735 A1 | 8/2015 | Joshi et al. |
| 2015/0303270 A1 | 10/2015 | Liaw |
| 2017/0104060 A1* | 4/2017 | Balakrishnan ............................. H01L 21/823412 |
| 2017/0110595 A1* | 4/2017 | Sengupta ............ H01L 29/0673 |
| 2017/0140933 A1 | 5/2017 | Lee et al. |
| 2017/0194143 A1 | 7/2017 | Balakrishnan et al. |
| 2017/0221893 A1* | 8/2017 | Tak ................ H01L 21/823481 |
| 2017/0250261 A1 | 8/2017 | Kim et al. |
| 2018/0358435 A1 | 12/2018 | Mochizuki et al. |
| 2019/0109040 A1* | 4/2019 | Chao ................ H01L 29/42392 |
| 2019/0157414 A1 | 5/2019 | Ando et al. |
| 2019/0214473 A1 | 7/2019 | Xie et al. |
| 2019/0341450 A1 | 11/2019 | Lee et al. |
| 2019/0393304 A1 | 12/2019 | Guillorn et al. |
| 2020/0066839 A1* | 2/2020 | Zhang ............ H01L 21/823412 |
| 2020/0091149 A1 | 3/2020 | Lee et al. |
| 2020/0105929 A1 | 4/2020 | Zhang et al. |
| 2020/0168715 A1 | 5/2020 | Wu et al. |
| 2021/0280673 A1* | 9/2021 | Gocho ............. H01L 29/66545 |

FOREIGN PATENT DOCUMENTS

| | | |
|---|---|---|
| CN | 108074983 A | 5/2018 |
| TW | 201606990 A | 2/2016 |
| TW | 201607039 A | 2/2016 |
| TW | 201614807 A | 4/2016 |
| TW | 201618309 A | 5/2016 |
| TW | 201640652 A | 11/2016 |
| TW | 201620822 A | 6/2017 |
| TW | 201719895 A | 6/2017 |

\* cited by examiner

GATE-ALL-AROUND (GAA) METHOD AND DEVICES

PRIORITY CLAIM AND CROSS-REFERENCE

This application is a divisional of U.S. patent application Ser. No. 16/409,386, filed on May 10, 2019, and entitled "GATE-ALL-AROUND (GAA) METHOD AND DEVICES" which claims priority to U.S. Provisional Patent Application No. 62/772,387, filed on Nov. 28, 2018, which application is hereby incorporated herein by reference.

BACKGROUND

Semiconductor devices are used in a large number of electronic devices, such as computers, cell phones, and others. Semiconductor devices comprise integrated circuits that are formed on semiconductor wafers by depositing many types of thin films of material over the semiconductor wafers, and patterning the thin films of material to form the integrated circuits. Integrated circuits include field-effect transistors (FETs) such as metal oxide semiconductor (MOS) transistors.

One of the goals of the semiconductor industry is to continue shrinking the size and increasing the speed of individual FETs. To achieve these goals, fin FETs (finFETs), multiple gate transistors, and gate all-around (GAA) transistors are being researched and implemented. However, with continuous shrinking dimensions, even this new device structure faces new challenges.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
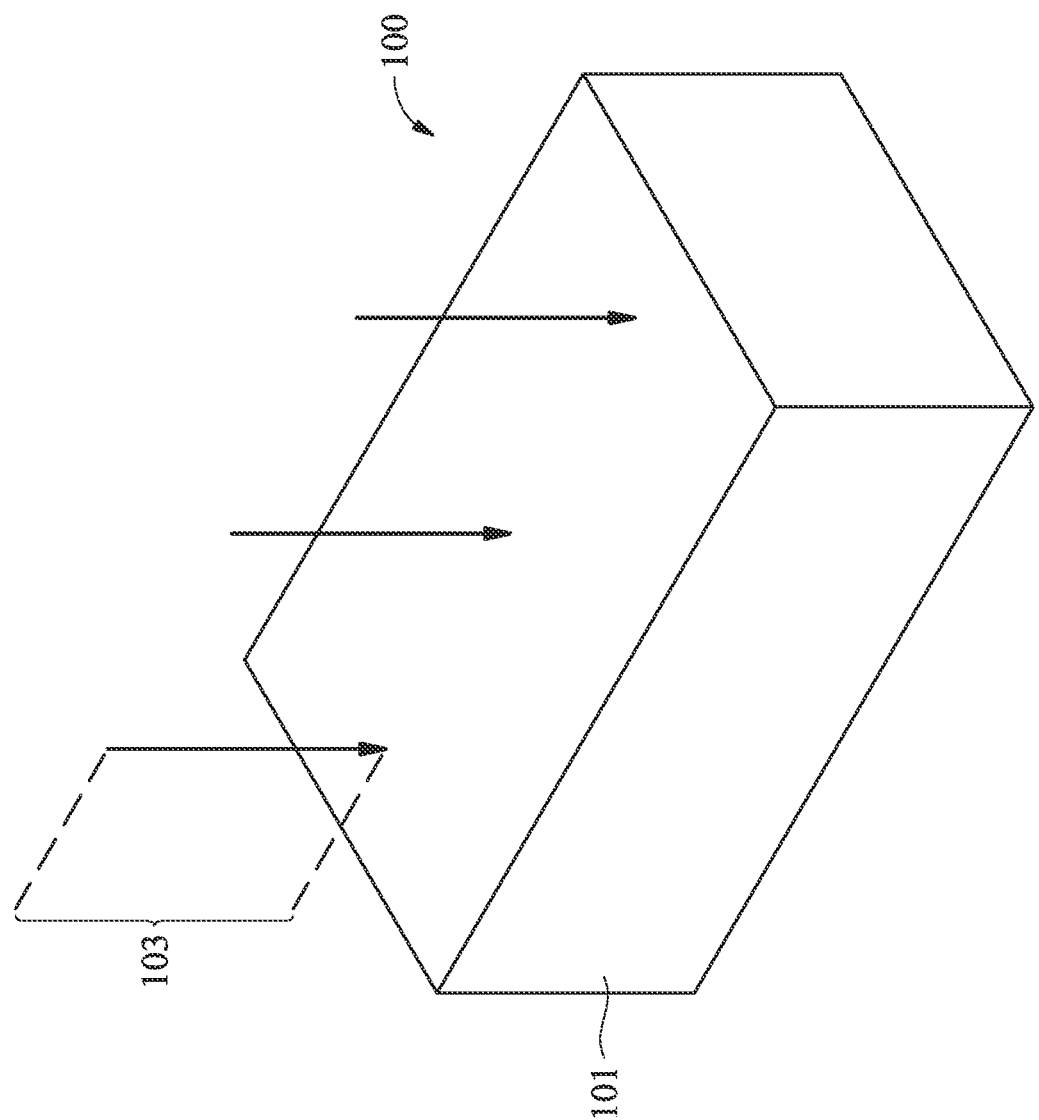
FIG. 1-21C illustrates various cross-sectional and perspective views of intermediate stages of forming a semiconductor device by forming and patterning two stacks of alternating layers of semiconductor materials, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1-21C illustrate the formation of two horizontal GAA transistors located at a distance from each other with modulated gate dielectric thickness and/or composition, sheet thickness, sheet space, sheet width, and stack number relative to each other. FIGS. 22-28B illustrate the formation of three horizontal GAA transistors located at different distances from each other with modulated gate dielectric thickness and/or composition, sheet thickness, sheet space, sheet width, and stack number relative to each other. FIGS. 1, 2A, 6A, 7A, 8A, 9, 10A, 11, 12A, 17, 18A, 19A, 20A, and 21A are illustrated in a three-dimensional (3D) view. FIGS. 2B, 3, 4A, 4B, 4C, 4D, 5A, 5B, 6B, 7B, 8B, 10B, 12B, 18B, 19B, 20B, 21B, 22, 23, 24, 25, 26, 27, 28A, and 28B are illustrated in a cross-sectional view along reference cross-section B-B (illustrated in FIGS. 2A, 6A, 12A, and 18A). FIGS. 12C, 13, 14, 15, 16, 18C, 19C, 20C, and 21C are illustrated in a cross-sectional view along reference cross-section C-C (illustrated in FIGS. 12A and 18A).

With reference now to FIG. 1, this figure illustrates an Anti-Punch-Through (APT) implant of dopants into a source material 100, in accordance with some embodiments. The source material 100 may be in the form of a substrate 101, such as a semiconductor substrate, which may be, for example, a silicon substrate, a silicon germanium substrate, a germanium substrate, a III-V material substrate (e.g., GaAs, GaP, GaAsP, AlInAs, AlGaAs, GaInAs, InAs, GaInP, InP, InSb, and/or GaInAsP; or a combination thereof), or a substrate formed of other semiconductor materials with, for example, high band-to-band tunneling (BTBT). Substrate 101 may be doped or un-doped. The substrate 101 may be doped with a p-type or an n-type impurity. In some embodiments, substrate 101 may be a bulk semiconductor substrate, such as a bulk silicon substrate that is a wafer, a semiconductor-on-insulator (SOI) substrate, a multi-layered or gradient substrate, or the like.

A first implantation 103 (represented in FIG. 1 by arrows) is performed in order to implant first dopants into a first source region of substrate 101. In an embodiment, first dopants may be implanted, for example, for an Anti-Punch-Through (APT) implant. However, any suitable implantation may be utilized.

Figure 2A:
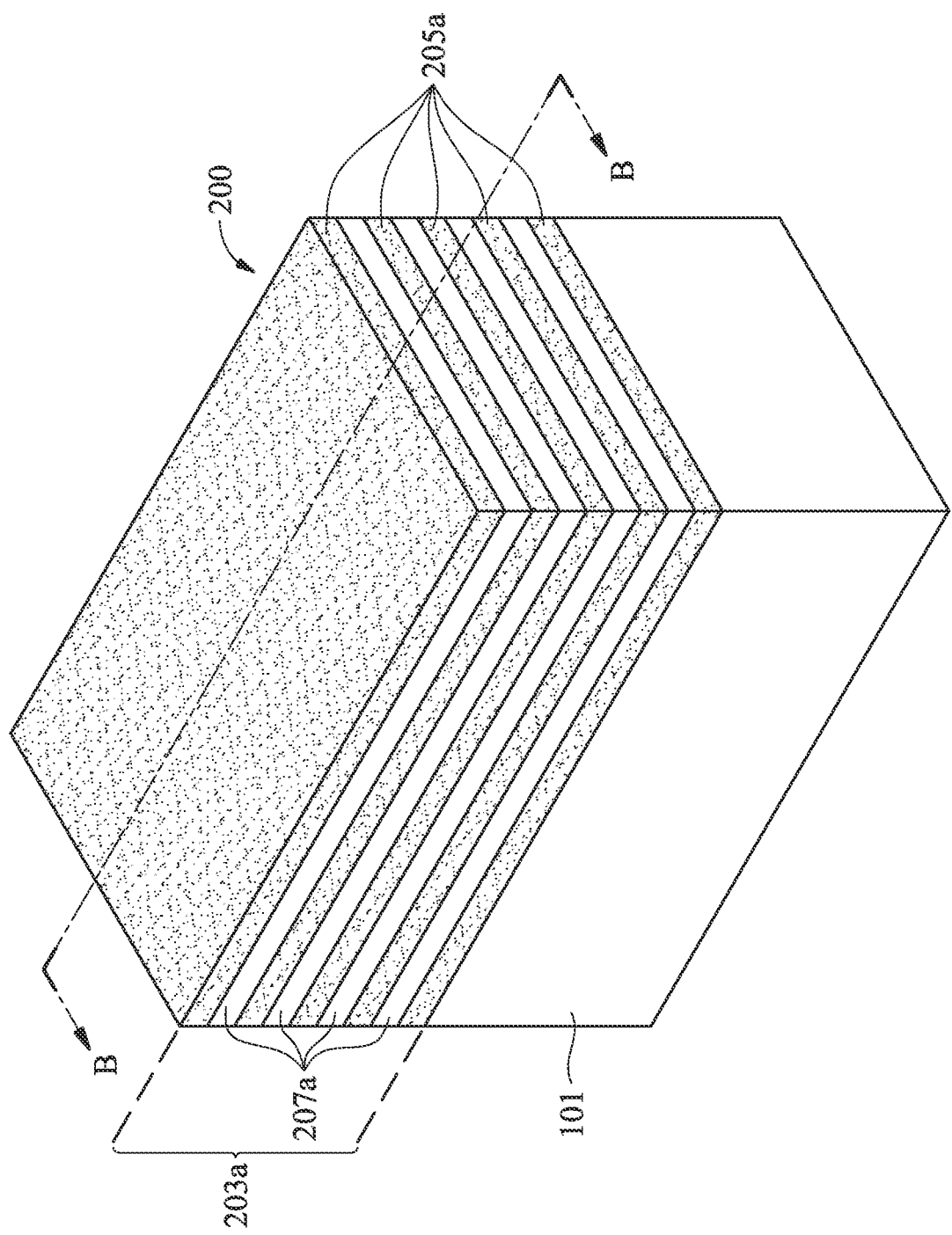
Figure 2B:
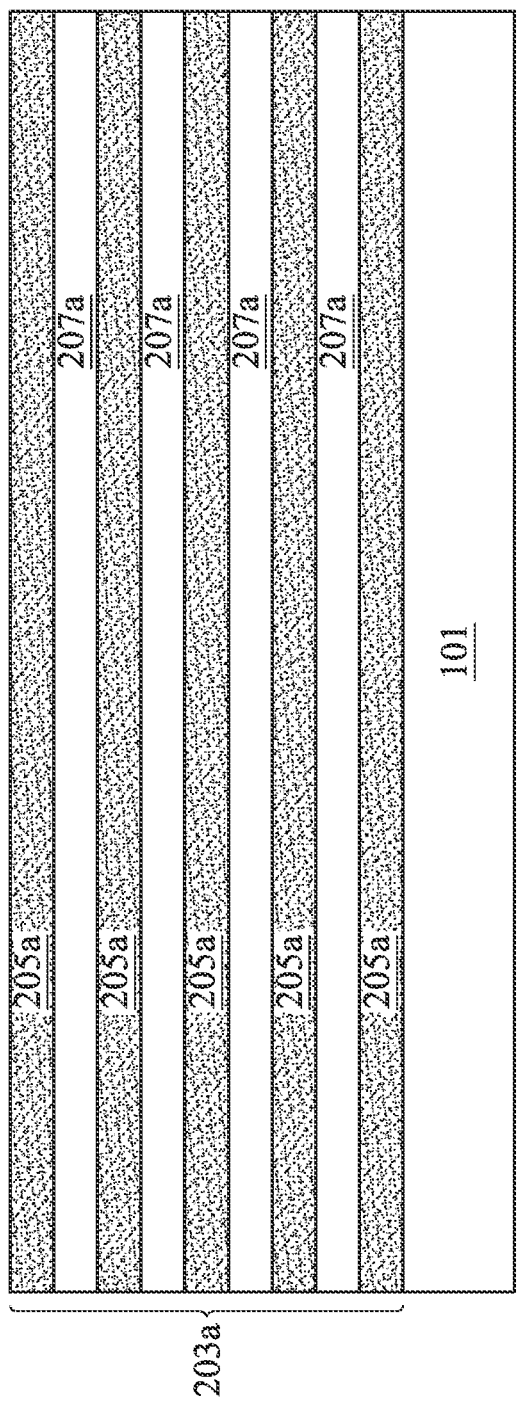

FIG. 2A is a three-dimensional (3D) view of a multi-layer structure 200 of an intermediate stage in the manufacturing of Gate All-Around (GAA) transistors. FIG. 2B is a cross-sectional view of the multi-layer structure 200 illustrated along cross-section B-B as shown in FIG. 2A. In FIGS. 2A and 2B, a first stack of alternating layers 203a is formed on the substrate 101. First stack of alternating layers 203a includes alternating layers of first semiconductor layers 205a of a first semiconductor material (e.g., SiGe layers) and second semiconductor layers 207a of a second semiconductor material (e.g., Si layers). Each of the first semiconductor layers 205a (e.g., SiGe layers) and the second semiconductor layers 207a (e.g., Si layers), in some embodiments, is epitaxially grown on its underlying layer. Stack of alternating layers 203a can include any number of the first semiconductor layers 205a (e.g., SiGe layers) and any number of the second semiconductor layers 207a (e.g., Si layers). The epitaxial growth can use CVD, MOCVD, MBE, LPE, VPE, UHVCVD, or the like, or a combination thereof. Each of the first semiconductor layers 205a (e.g., SiGe layers) and the second semiconductor layers 207a (e.g., Si layers) can be a group IV material, such as Si, Ge, SiGe, SiGeSn, SiC or the like; a group III-group V compound material, such as GaAs, GaP, GaAsP, AlInAs, AlGaAs, GaInAs, InAs, GaInP, InP, InSb, GaInAsP or the like.

Stacks of alternating layers 203a can include any number of the first semiconductor layers 205a (e.g., SiGe layers) and any number of the second semiconductor layers 207a (e.g., Si layers). As illustrated, for example, stack of alternating layers 203a has five first semiconductor layers 205a (e.g., SiGe layers) and four second semiconductor layers 207a (e.g., Si layers. The numbers of first semiconductor layers 205 (e.g., SiGe layers) and second semiconductor layers 207 (e.g., Si layers) may be modulated by the number of cycles of epitaxial growth used to form the first stack of alternating layers, respectively.

Figure 3:
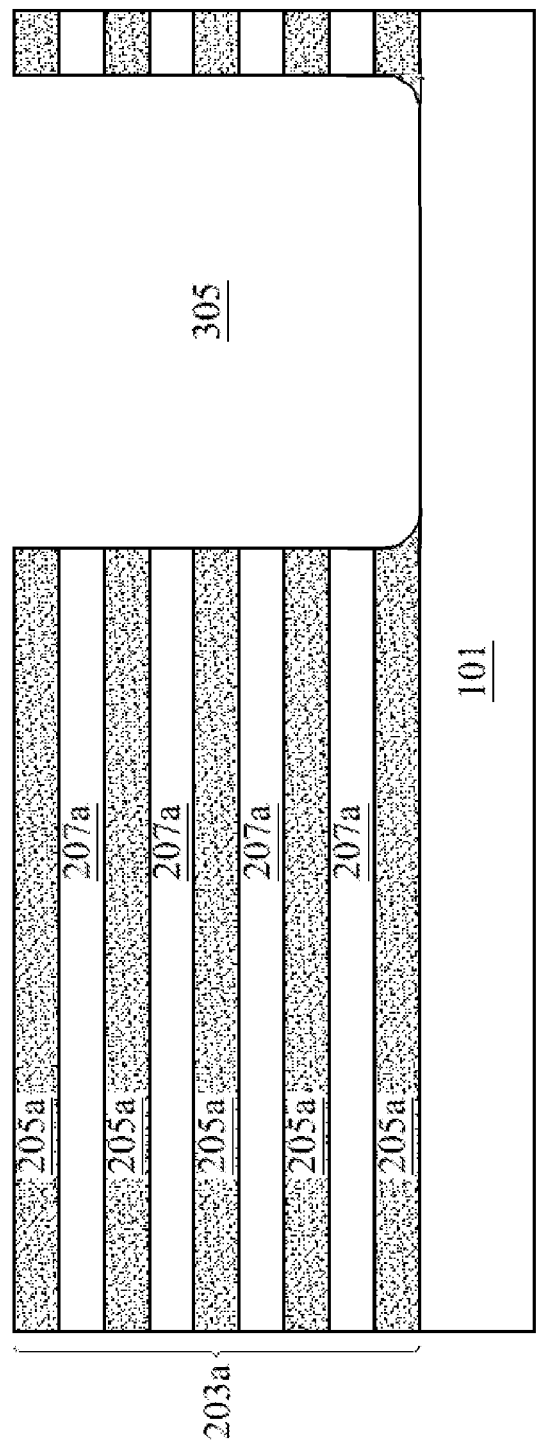

FIG. 3 illustrates the patterning and etching of a trench 305 into stack of alternating layers 203a. Photolithography techniques may be utilized to pattern the stack of alternating layers 203a. Generally, a photoresist material (not shown) is deposited over the stack of alternating layers 203a. The photoresist material is irradiated (exposed) with radiation, e.g. light, through a patterned reticle in order to induce a reaction in those portions of the photoresist material exposed to the energy. The photoresist material is developed to remove a portion of the photoresist material, wherein the remaining photoresist material protects the underlying material from subsequent processing steps.

After the patterning, the trench 305 is etched as illustrated in FIG. 3 with a vertical profile. The etching process may be a dry etch. The etch process may include a reactive ion etch (RIE), neutral beam etch (NBE), inductively coupled plasma (ICP) etch, capacitively coupled plasma (CCP) etch, ion beam etch (IBE), the like, or a combination thereof. The etch process may be anisotropic. In some embodiments, the etching process can include a plasma using a first gas comprising carbon tetrafluoride ($CF_4$), hexafluoroethane ($C_2F_6$), octafluoropropane ($C_3F_8$), fluoroform ($CHF_3$), difluoromethane ($CH_2F_2$), fluoromethane ($CH_3F$), a carbon fluoride (e.g., $C_xF_y$, where x can be in a range from 1 to 5 and y can be in a range from 4 to 8), the like, or a combination thereof. The plasma can further use a second gas comprising nitrogen ($N_2$), hydrogen ($H_2$), oxygen ($O_2$), argon (Ar), xenon (Xe), helium (He), carbon monoxide (CO), carbon dioxide ($CO_2$), carbonyl sulfide (COS), the like, or a combination thereof. An inert gas may be optionally supplied during the etching process. The trench 305 may contact a top surface of the substrate 101 or it may be etched to a depth below the top surface of substrate 101.

Figure 4A:
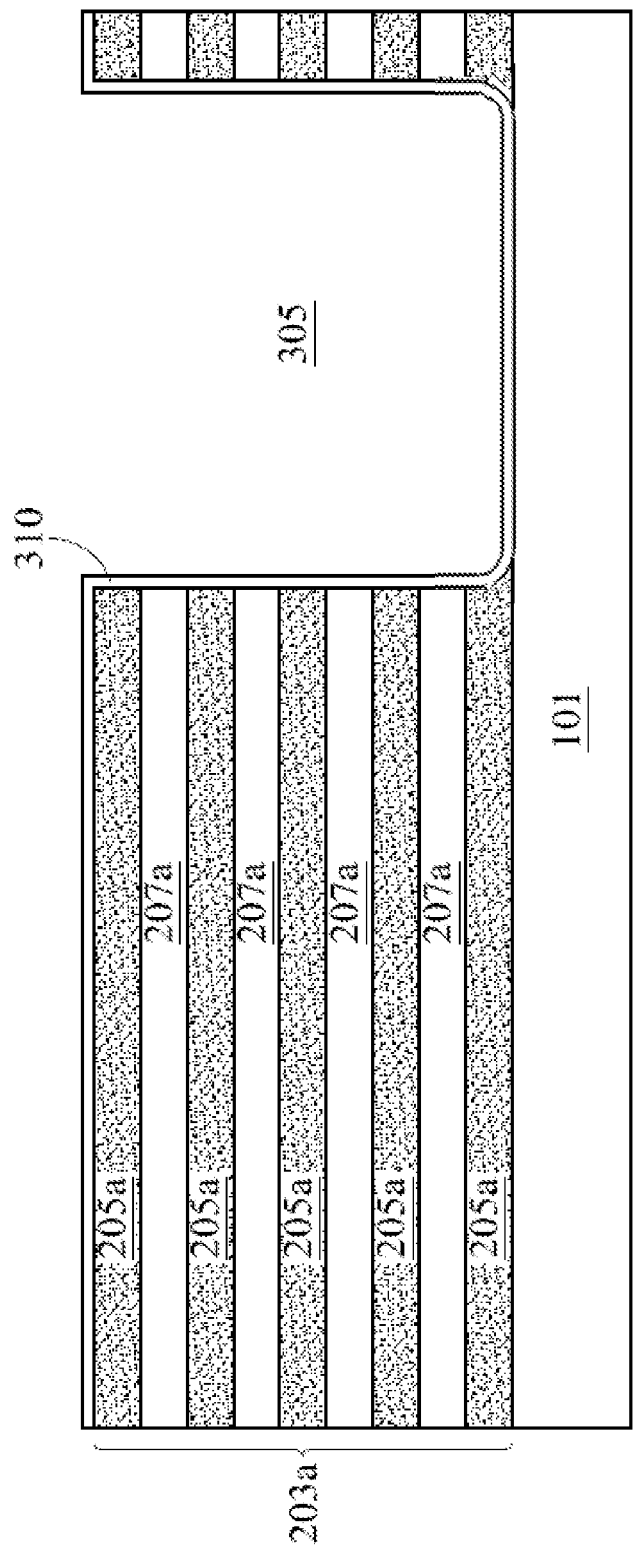

FIG. 4A illustrates an embodiment in which a spacer layer 310 is formed on the sidewalls and bottom surface of the trench 305 and over the topmost surface of the stack of alternating layers 203a. Spacer layer 310 may be formed with a dielectric material such as silicon nitride, silicon carbon-oxynitride (SiCN), or the like.

Figure 4B:
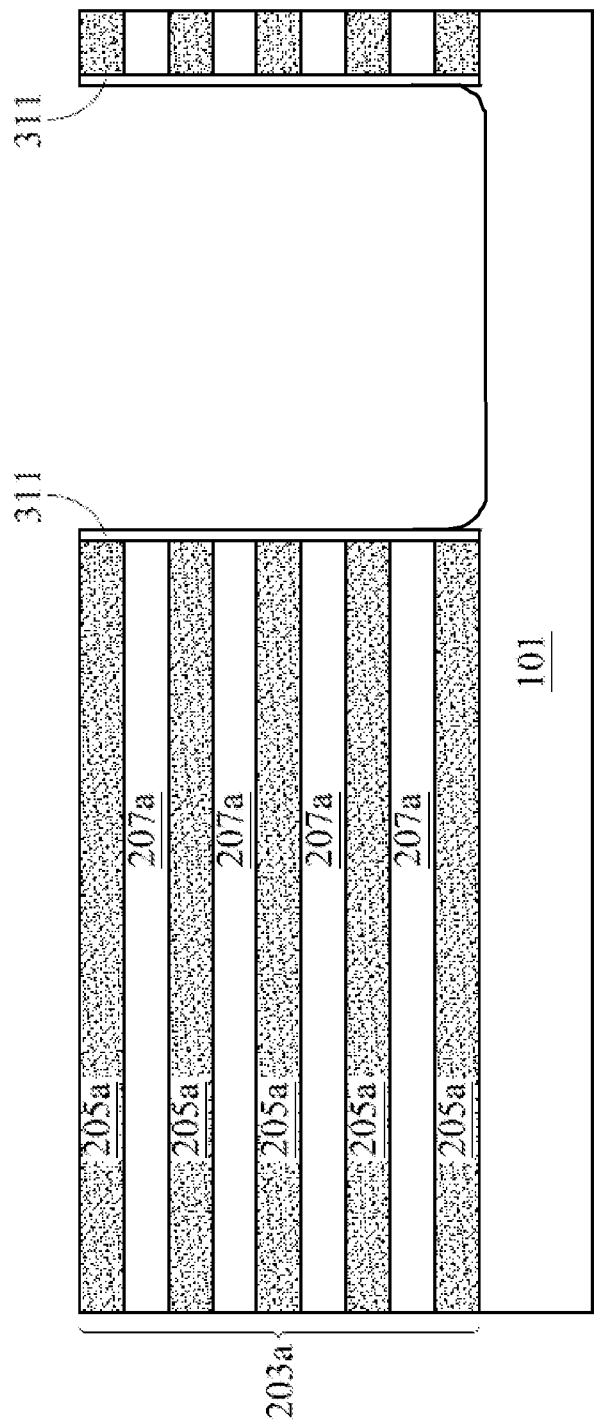

FIG. 4B illustrates the removal of horizontal portions of the spacer layer 310. In an embodiment, an anisotropic etch process is utilized to remove the spacer layer 310 over horizontal portions of the device. Due to the difference in the thicknesses of the spacer layer 310 over horizontal portions of the device and along sidewalls of the trench 305, the spacer layer 311 remains along sidewalls of the trench 305, while the bottom surface of the trench 305 and the topmost surface of the stack of alternating layers 203a are exposed.

Figure 4C:
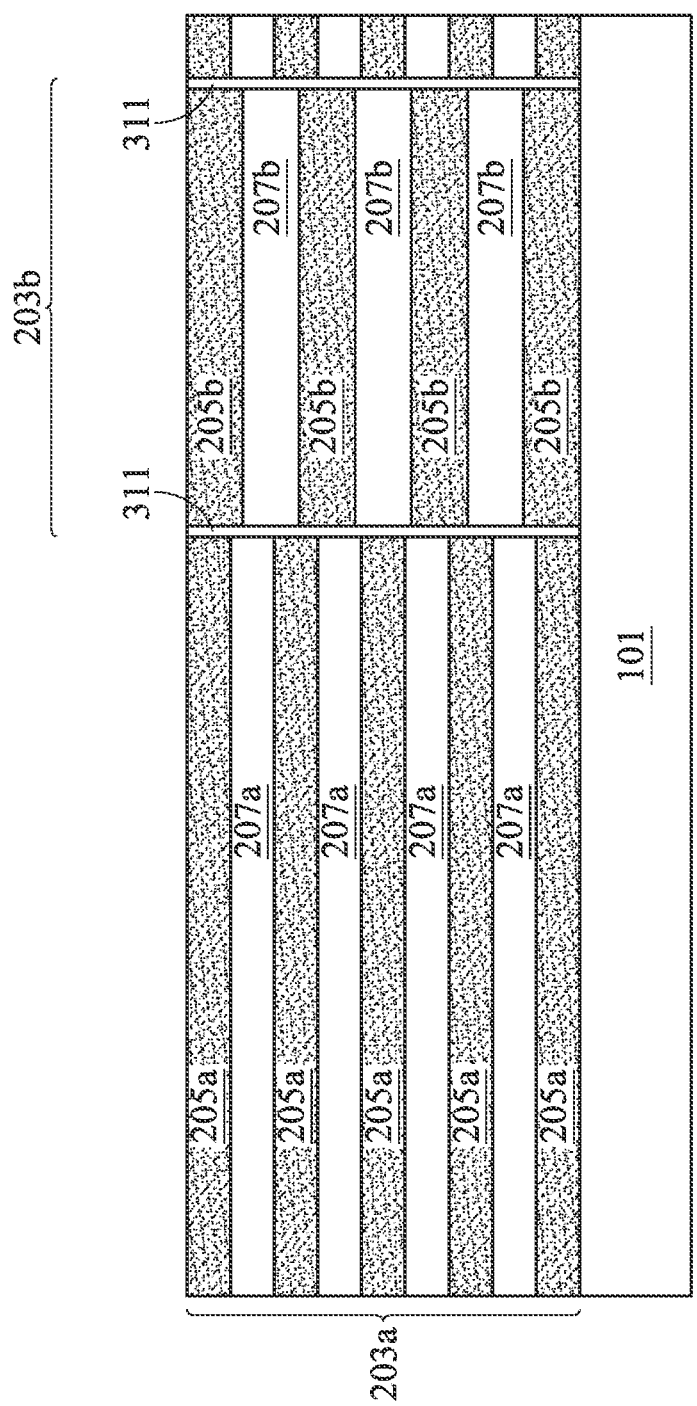

FIG. 4C illustrates an embodiment of the formation of a second stack of alternating layers 203b in the trench 305. Second stack of alternating layers 203b includes alternating layers of first semiconductor layers 205b of a first semiconductor material (e.g., SiGe layers) and second semiconductor layers 207b of a second semiconductor material (e.g., Si layers). Each of the first semiconductor layers 205b (e.g., SiGe layers) and the second semiconductor layers 207b (e.g., Si layers), in some embodiments, is epitaxially grown on its underlying layer. The second stack of alternating layers 203b can include any number of the first semiconductor layers 205b (e.g., SiGe layers) and any number of the second semiconductor layers 207b (e.g., Si layers). As illustrated, for example, stack of alternating layers 203b has four first semiconductor layers 205b (e.g., SiGe layers) and three second semiconductor layers 207b (e.g., Si layers). The numbers of first semiconductor layers 205b (e.g., SiGe layers) and second semiconductor layers 207b (e.g., Si layers) may be modulated by the number of cycles of epitaxial growth used to form the second stack of alternating layers 203b.

Figure 4D:
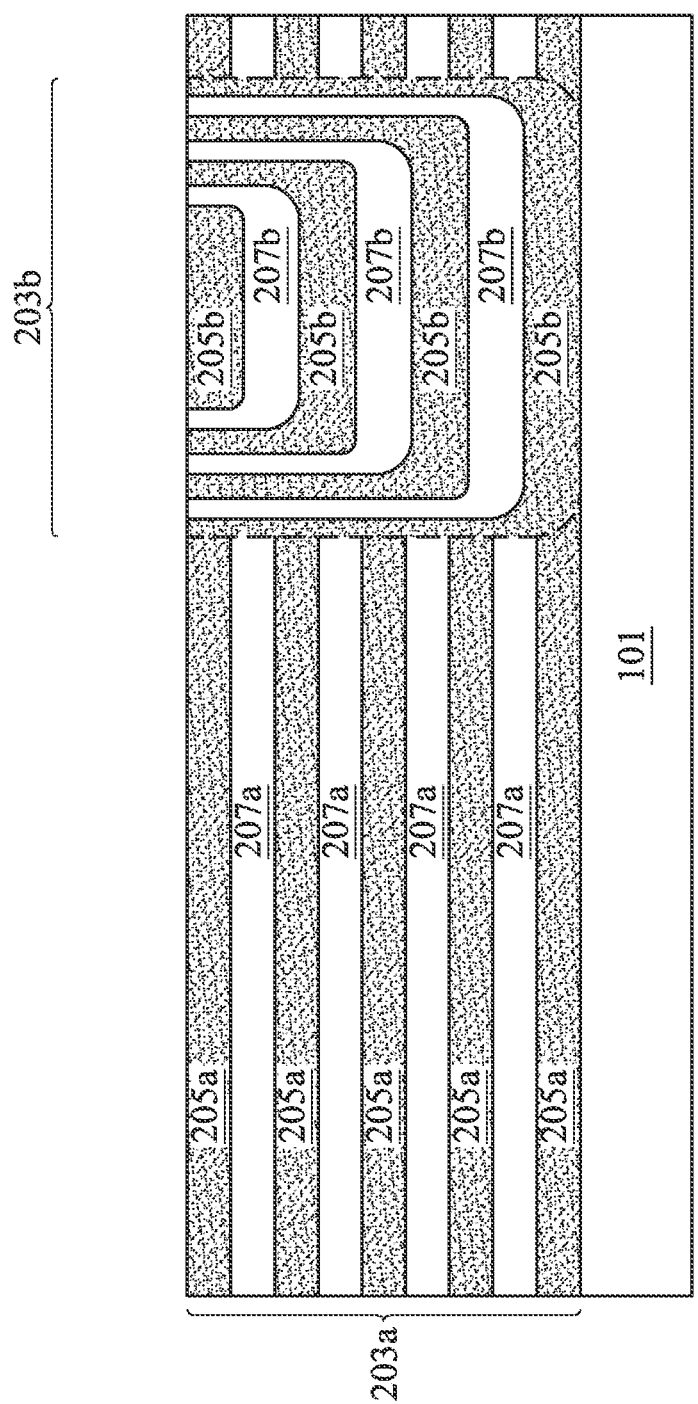

FIG. 4D illustrates another embodiment of the formation of the second stack of alternating layers 203b. Unlike the embodiment illustrated in FIGS. 4A through 4C, the embodiment illustrated in FIG. 4D does not involve the formation of a spacer. The second stack of alternating layers 203b is formed in the trench 305 with alternating layers of first semiconductor layers 205b of a first semiconductor material (e.g., SiGe layers) and second semiconductor layers 207b of a second semiconductor material (e.g., Si layers) formed conformally on the sidewalls and bottom of the trench 305. Each of the first semiconductor layers 205b (e.g., SiGe layers) and the second semiconductor layers 207b (e.g., Si layers) is epitaxially and conformally grown on its underlying layer.

The average thicknesses of first semiconductor layers 205a may be different from the average thicknesses of first semiconductor layers 205b and the average thicknesses of second semiconductor layers 207a may be different from the average thicknesses of second semiconductor layers 207b. The relative average thicknesses of the layers will determine the sheet spacing between nanosheets of the device. Larger sheet spacing can enable thicker input-output (IO) gate oxide on the nanosheets, which is useful for, e.g., IO devices. In an embodiment, the relative average thicknesses of the first semiconductor layers 205 and the second semiconductor layers 207 are determined by controlling the epitaxial growth of the layers through modulating the reactant gas flow rate, the growth temperature, or the time length of the periods of epitaxial growth of each layer. The first semiconductor layers 205b of the second stack of alternating layers 203b may have a thickness greater than the first semiconductor layers 205a of the first stack of alternating layers 203a. The second semiconductor layers 207b of the second stack of alternating layers 203b may have a thickness greater than the second semiconductor layers 207a of the first stack of alternating layers 203a. The average thicknesses of first semiconductor layers 205a may be between about 5 nm to about 30 nm, the average thicknesses of second semiconductor layers 207a may be between about 3 nm to about 30 nm, the average thicknesses of first semiconductor layers 205b may be between about 8 nm to about 40 nm, and the average thicknesses of second semiconductor layers 207b may be between about 3 nm to about 40 nm. The ratio of the average thicknesses of first semiconductor layers 205a to the average thicknesses of second semiconductor layers 207a may be between about 10:1 to about 1:6. The ratio of the average thicknesses of first semiconductor layers 205b to the average thicknesses of second semiconductor layers 207b may be between about 10:1 to about 1:5.

In some embodiments, the material of the first semiconductor layers 205a and 205b is different from the material of the second semiconductor layers 207a and 207b. For example, the first semiconductor layers 205a and 205b may be SiGe layers and the second semiconductor layers 207a and 207b may be Si layers or SiC layers. In another embodiment, for example, the first semiconductor layers 205a and 205b may be Si layers or SiC layers and the second semiconductor layers 207a and 207b may be SiGe layers. The difference in materials may allow for different strains and/or may allow for an etch selectivity between the first semiconductor layers, 205a and 205b, and the second semiconductor layers, 207a and 207b, as will be apparent below.

Figure 5A:
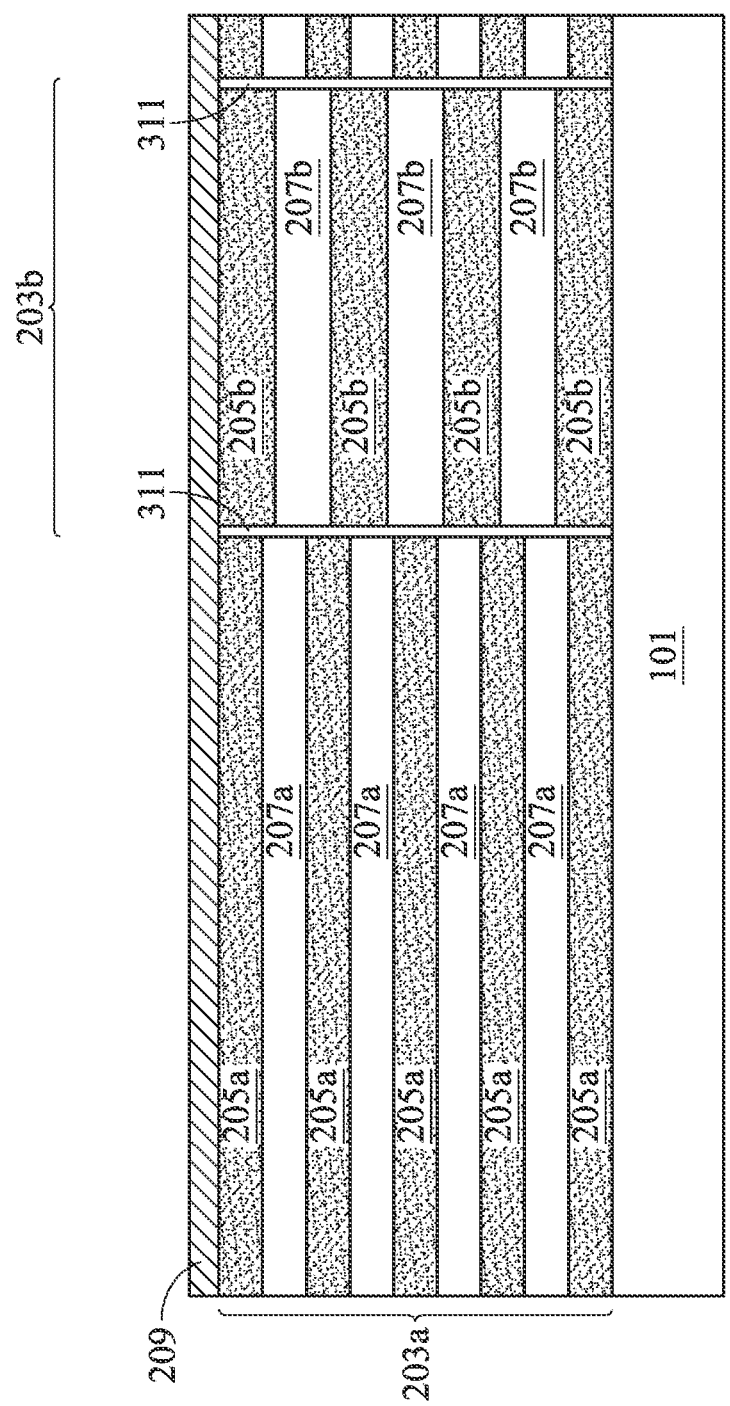
Figure 5B:
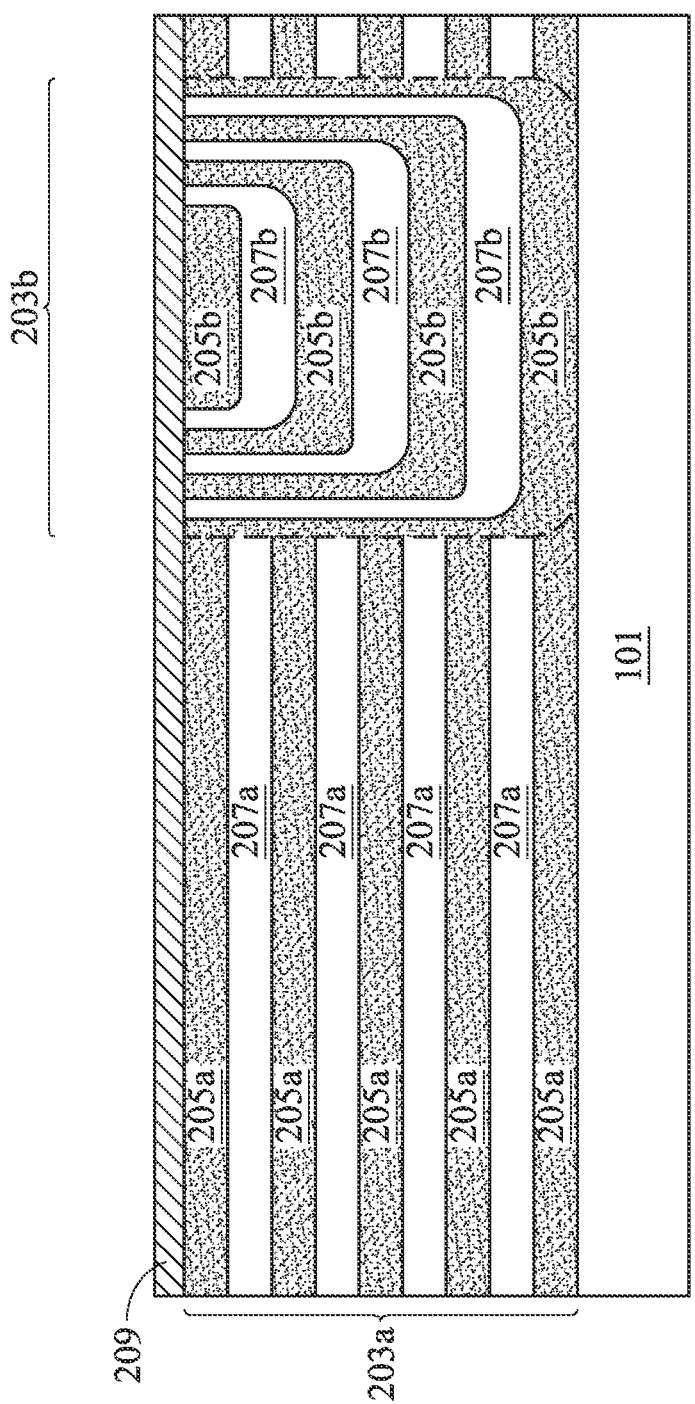

FIGS. 5A and 5B illustrate embodiments in which the first and second stacks of alternating layers 203a and 203b of the desired height and/or number of layers are subject to a hardmask layer 209 deposition. The embodiment illustrated in FIG. 5A follows from the embodiment illustrated above in FIG. 4C and the embodiment illustrated in FIG. 5B follows from the embodiment illustrated above in FIG. 4D. The hardmask layer 209 may be deposited over the topmost surface of the stacks of alternating layers 203a and 203b, as shown in FIGS. 5A and 5B. The hardmask layer 209 may be formed using a deposition process in a deposition chamber or may use any other suitable process of forming the hardmask layer 209 above the first and second stacks of alternating layers 203a and 203b. The hardmask 209 may include sublayers, such as a pad oxide layer and an overlying pad nitride layer. The pad oxide layer may be a thin film comprising silicon oxide formed, for example, using a thermal oxidation process. The pad oxide layer may act as an adhesion layer between the first and second stacks of alternating layers 203a and 203b and the overlying pad nitride layer. In some embodiments, the pad nitride layer is formed of silicon nitride, silicon oxynitride, silicon carbonitride, the like, or a combination thereof, and may be formed using low-pressure chemical vapor deposition (LPCVD) or plasma enhanced chemical vapor deposition (PECVD), as examples.

Figure 6A:
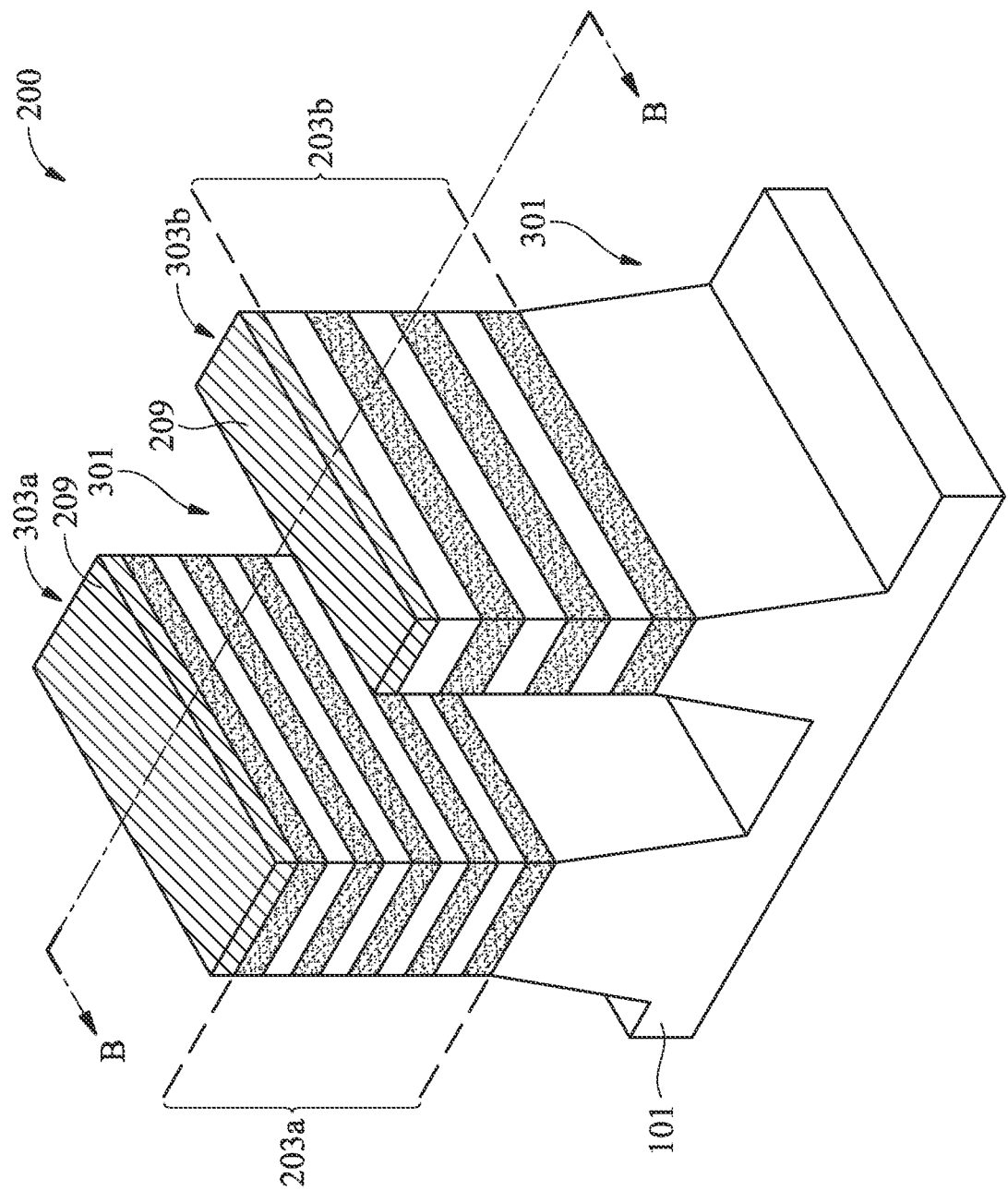
Figure 6B:
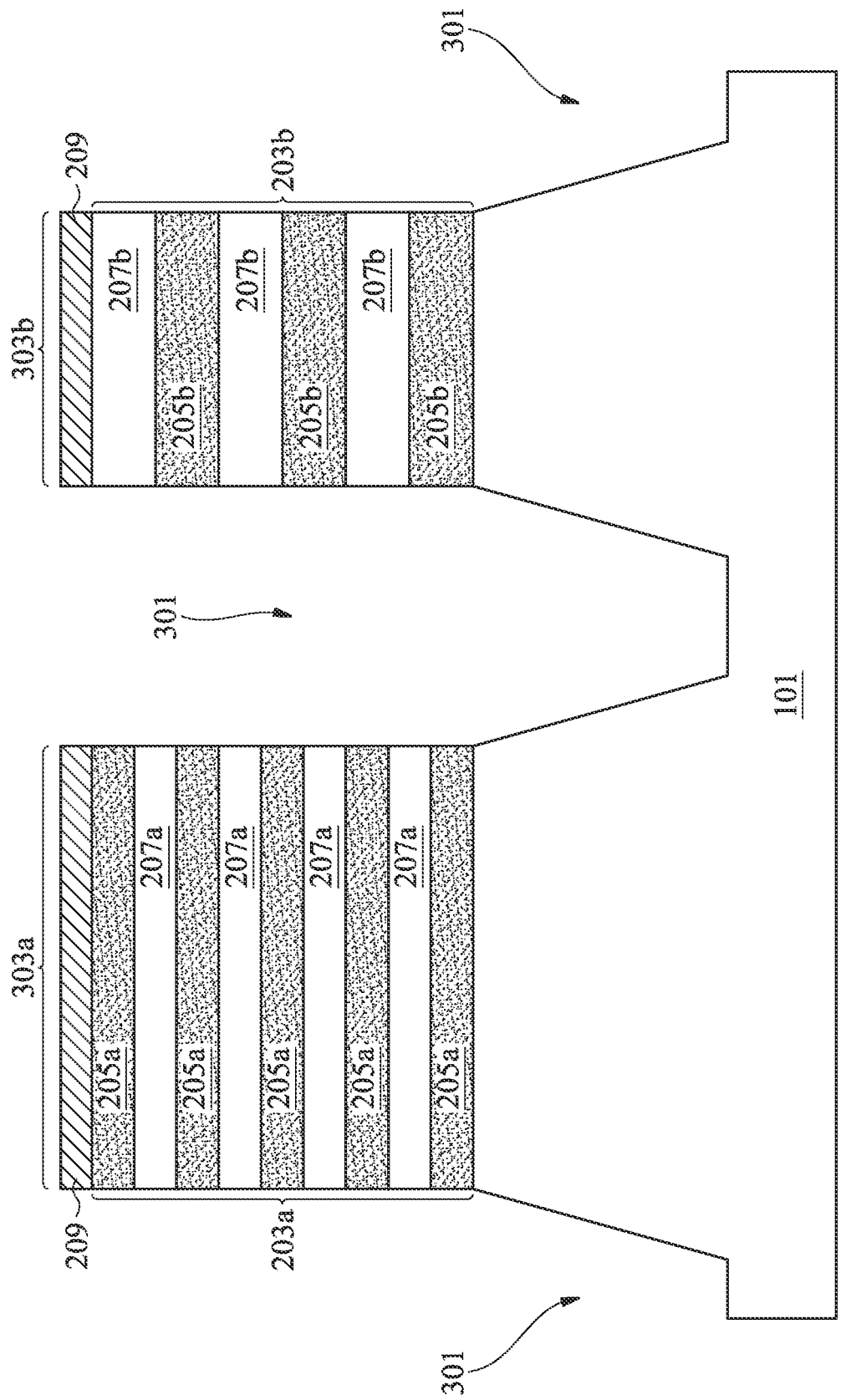

FIG. 6A is a three-dimensional (3D) view of the multi-layer structure 200 and FIG. 6B is a cross-sectional view of the multi-layer structure 200 illustrated along cross-section B-B as shown in FIG. 6A. FIGS. 6A and 6B illustrate an embodiment of a patterning process that is performed to form trenches 301 in the multi-layer structure 200, after the hardmask layer 209 has been deposited on the top surface of the multi-layer structure 200 (as shown in FIGS. 5A and 5B). In some embodiments, photolithography techniques are utilized to pattern the hardmask layer 209. Generally, a photoresist material (not shown) is deposited over the hardmask layer 209. The photoresist material is irradiated (exposed) with radiation, e.g. light, through a patterned reticle in order to induce a reaction in those portions of the photoresist material exposed to the energy. The photoresist material is developed to remove a portion of the photoresist material, wherein the remaining photoresist material protects the underlying material from subsequent processing steps, such as etching.

In FIGS. 6A and 6B, after the patterning process is performed to the multi-layered structure 200 to form trenches 301, remaining regions of the stacks of alternating layers 203 and the underlying substrate 101 form fins, such as a first fin 303a and a second fin 303b (collectively referred to as fins 303). As can be seen in FIGS. 6A and 6B, the fins 303 comprise portions of the stacks of alternating layers 203a and 203b (e.g., portions of the first semiconductor layers 205a and 205b (e.g., SiGe layers) and portions of the second semiconductor layers 207a and 207b (e.g., Si layers)), and portions of the substrate 101. In embodiments in which the second stack of alternating layers 203b was formed between sidewalls covered by the spacer 311 as illustrated in FIGS. 4A-C and 5A, the spacer 311 is also removed in the etching of the second fin 303b. In embodiments in which the second stack of alternating layers 203b was formed conformally on the sidewalls and bottom of the trench 305 as illustrated above in FIGS. 4D and 5B, the etching of the second fin 303b removes the portions of first semiconductor layers 205c and second semiconductor layers 207c that are not horizontal. As discussed in greater detail below, the fins 303 will be used to form horizontal nanosheets (NSs) for one or more of an n-type FinFET and/or a p-type FinFET. Although two fins (first fin 303a and second fin 303b) are shown in FIG. 2B, it is to be understood that any suitable number and type of fins may be utilized.

Fins 303a and 303b may be patterned to have different widths varied from 4 to 100 nm. For example, in an embodiment, the width of fin 303a may be between about 4 nm to about 100 nm, and the width of fin 303b may be between about 4 nm to about 100 nm. The ratio of the width of fin 303a to the width of fin 303b may be between about 25:1 to about 1:25. The patterning of the fins 303 will determine the widths of the nanosheets (sheet width) produced from the fins in following steps. Larger sheet width (or $W_{eff}$, the NS effective width), can enable higher speed performance. Smaller $W_{eff}$ can enable lower power applications.

Figure 7A:
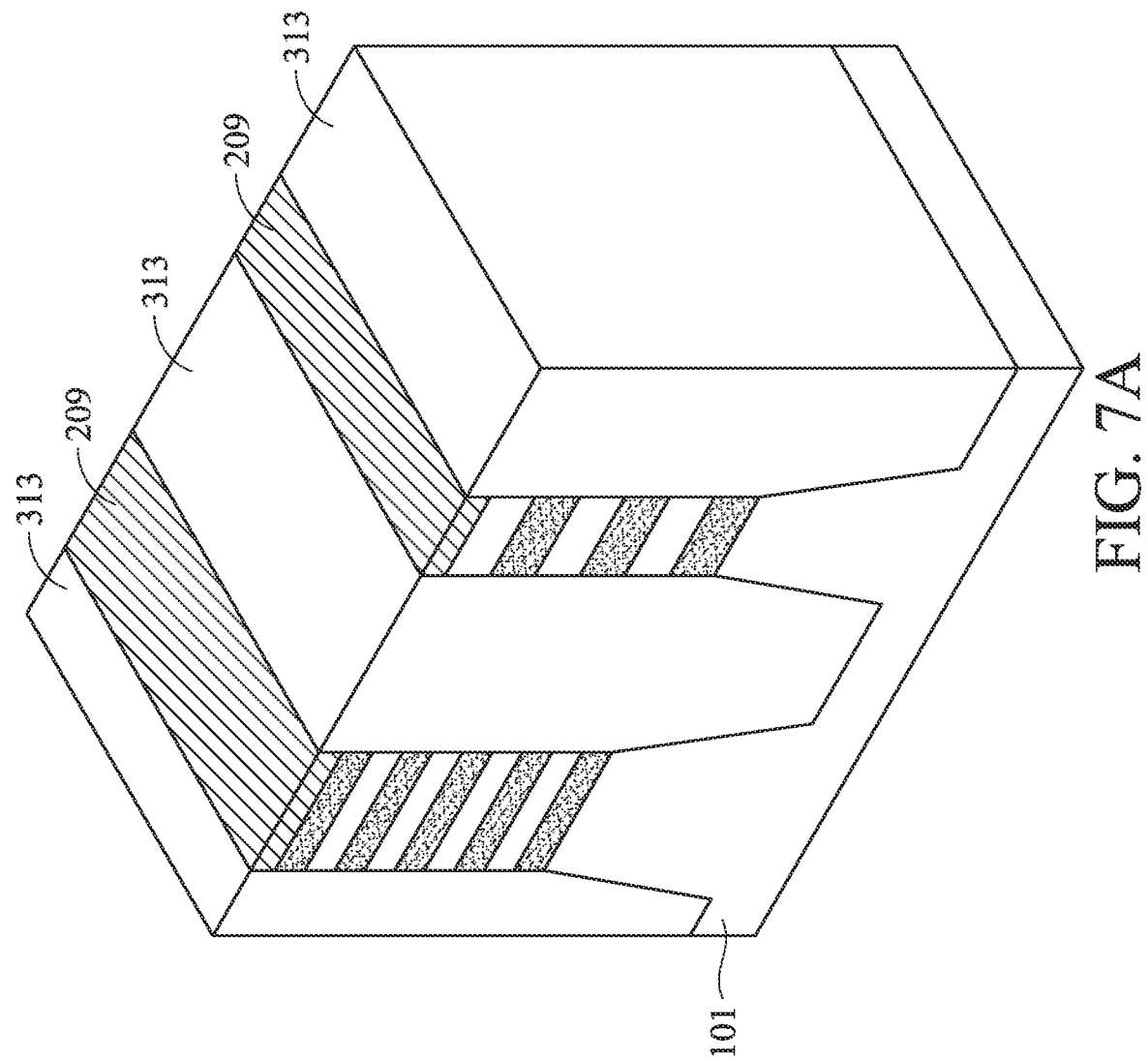
Figure 7B:
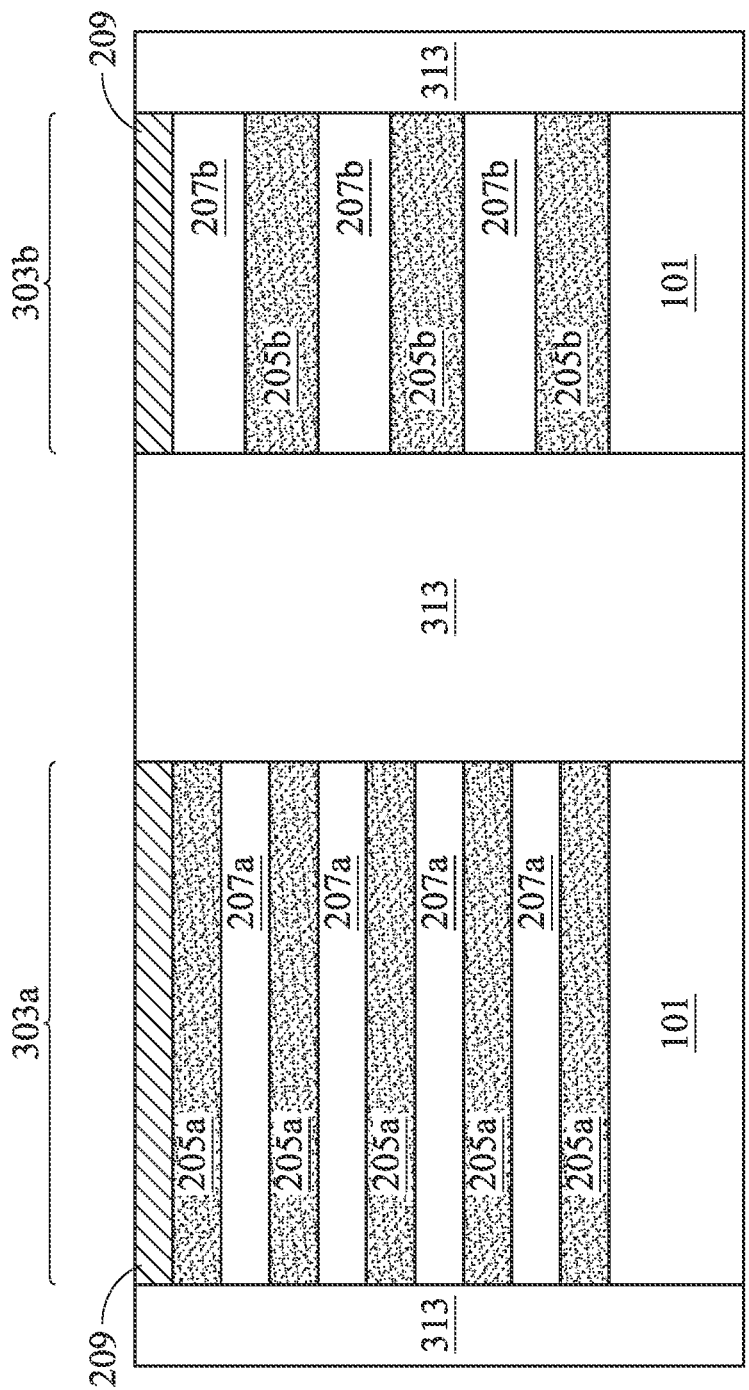

FIGS. 7A and 7B illustrate the formation of shallow trench isolation regions (STIs) 313, in accordance with some embodiments. In FIGS. 7A and 7B, a dielectric insulating material is deposited adjacent to fins 303a and 303b to form STIs 313. The STIs 313 may be made of suitable dielectric materials such as silicon oxide, silicon nitride, silicon oxynitride, fluoride-doped silicate glass (FSG), low-k dielectrics such as carbon doped oxides, extremely low-k dielectrics such as porous carbon doped silicon dioxide, a polymer such as polyimide, combinations of these, or the like. The STIs 313 may include a liner (not illustrated) and a dielectric insulating material over the liner. The liner may be formed as a conformal layer, whose horizontal portions and vertical portions have thicknesses close to each other. In some embodiments, the STIs 313 are formed through a process such as CVD, flowable CVD (FCVD), or a spin-on-glass process, although any acceptable process may be utilized. Subsequently, the STIs 313 may be subject to one or more of a hardmask removal process to remove the hardmask layer 209 and a process for removal of portions of the STIs 313 extending over the top surfaces of the fins 303 using, for example, chemical mechanical polishing (CMP), an etch process, or the like.

Figure 8A:
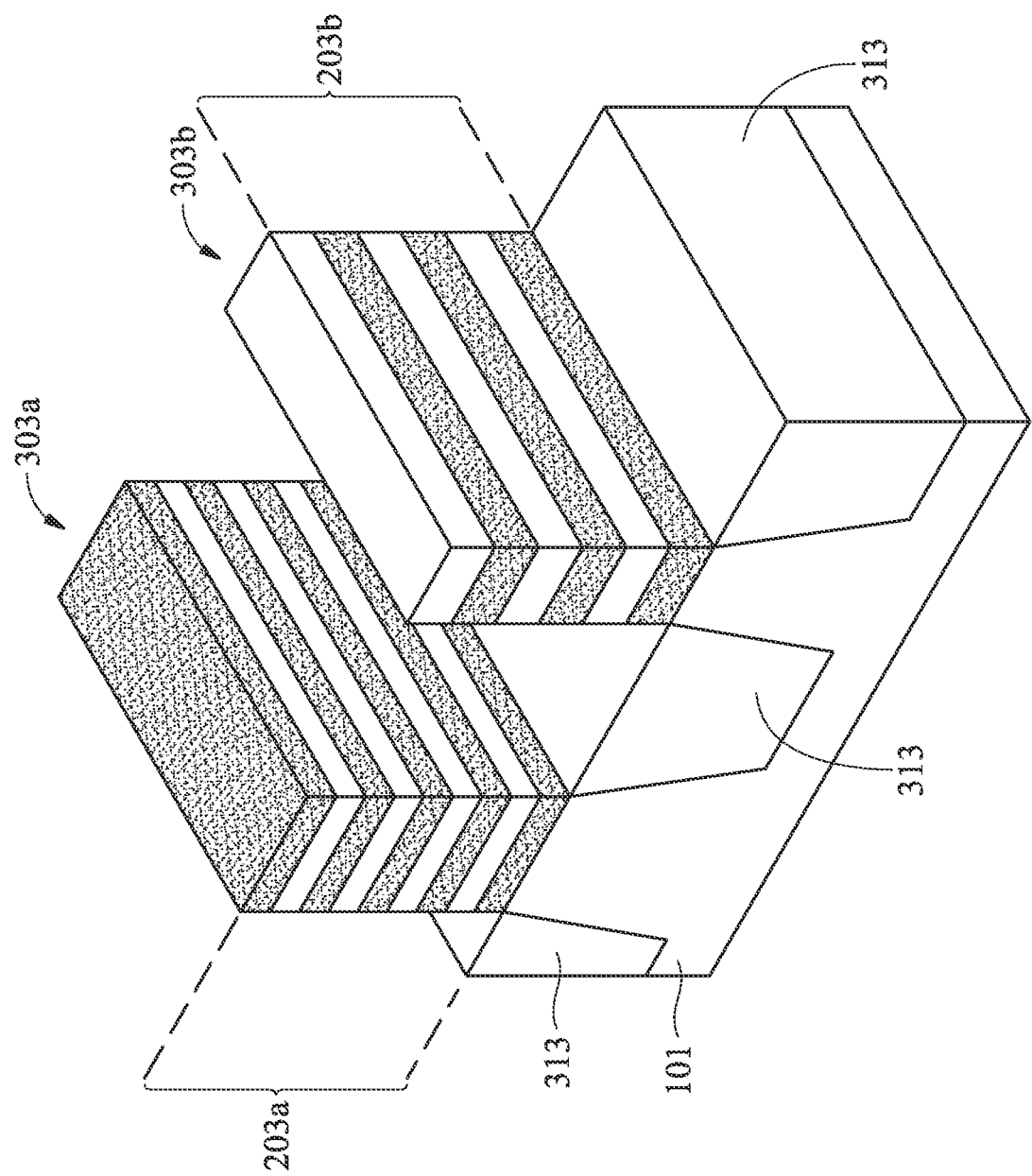
Figure 8B:
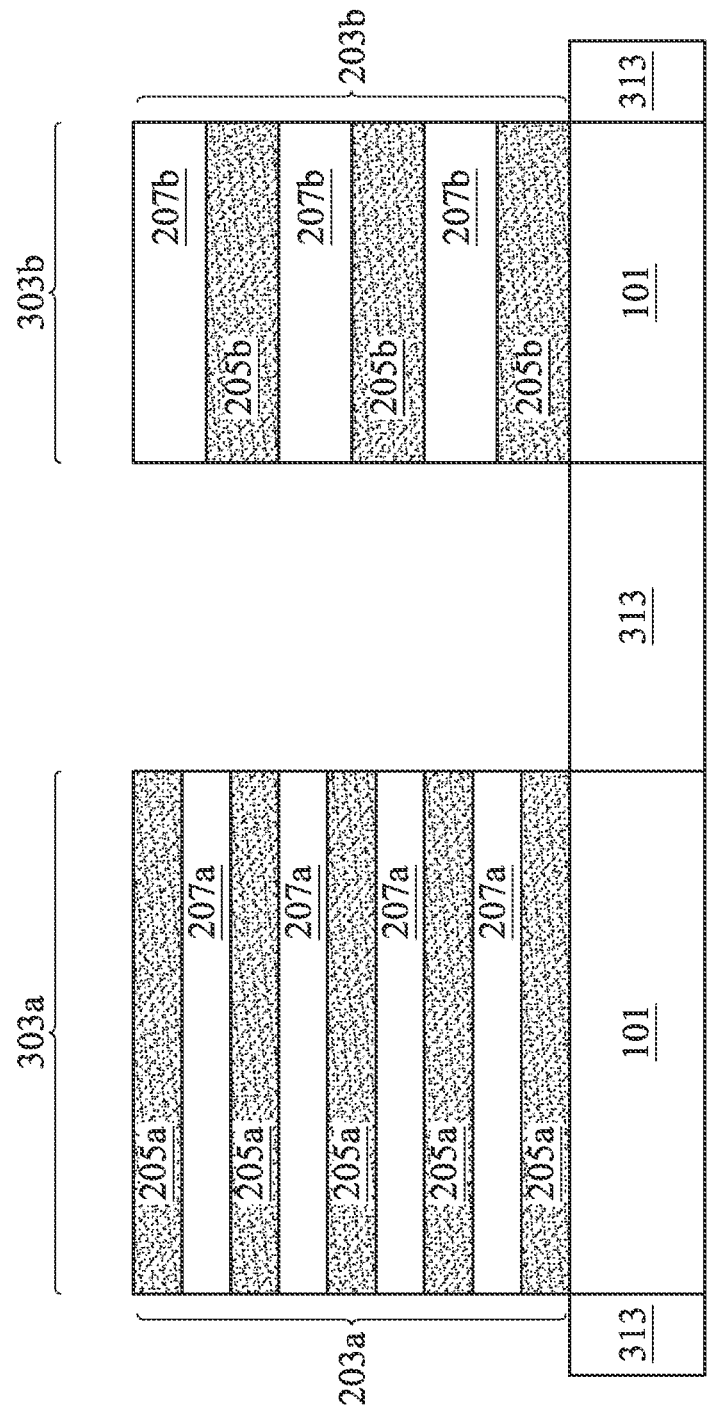

In FIGS. 8A and 8B, the sidewalls of the fins 303 are exposed by recessing the STIs 313. In an embodiment, the STIs 313 are recessed using one or more selective etch processes. A depth of the recess is determined by the height of the stacks of alternating layers 203a and 203b. In an embodiment, the recess extends to a depth such that the bottommost first semiconductor layers 205a and 205b are exposed. Alternatively, bottom-most first semiconductor layers 205a and 205b (e.g., SiGe layers) may remain below the upper surface of the STIs 313.

Figure 9:
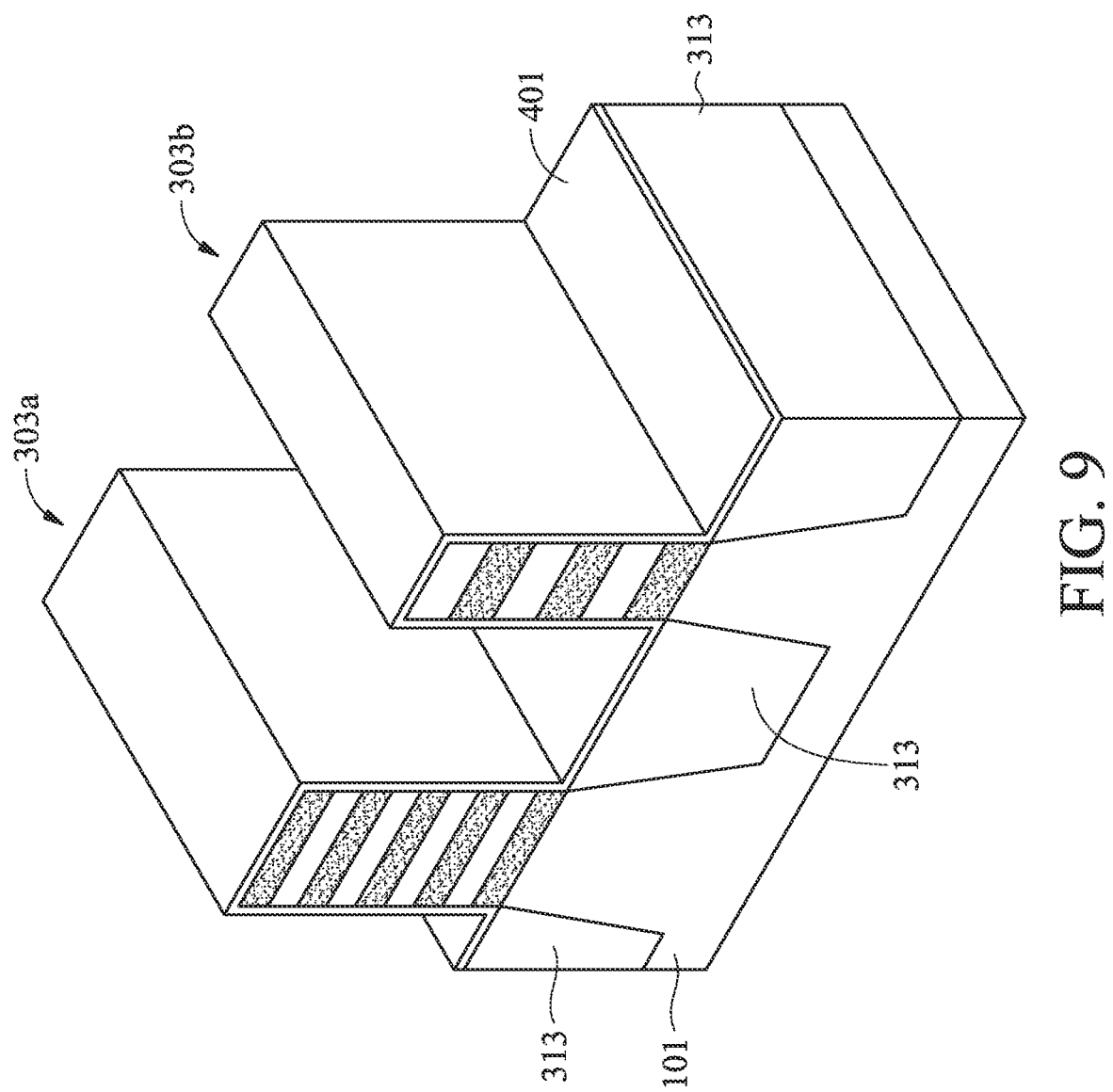

Referring to FIG. 9, a dummy gate oxide layer 401 is formed over the exposed fins 303. In some embodiments, the dummy gate oxide layer 401 may be formed by thermal oxidation, CVD, sputtering, or any other methods known and used in the art for forming a dummy gate oxide layer 401. In some embodiments, the dummy gate oxide layer 401 may be formed of a same material as the STIs 313. In other embodiments, the dummy gate oxide layer 401 may be made of one or more suitable dielectric materials such as silicon oxide, silicon nitride, low-k dielectrics such as carbon doped oxides, extremely low-k dielectrics such as porous carbon doped silicon dioxide, a polymer such as polyimide, the like, or a combination thereof. In other embodiments, the dummy gate oxide layer 401 includes dielectric materials having a high dielectric constant (k value), for example, greater than 3.9. The materials may include silicon nitrides, oxynitrides, metal oxides such as $HfO_2$, $HfZrO_x$, $HfSiO_x$, $HfTiO_x$, $HfAlO_x$, the like, or combinations and multi-layers thereof.

Figure 10A:
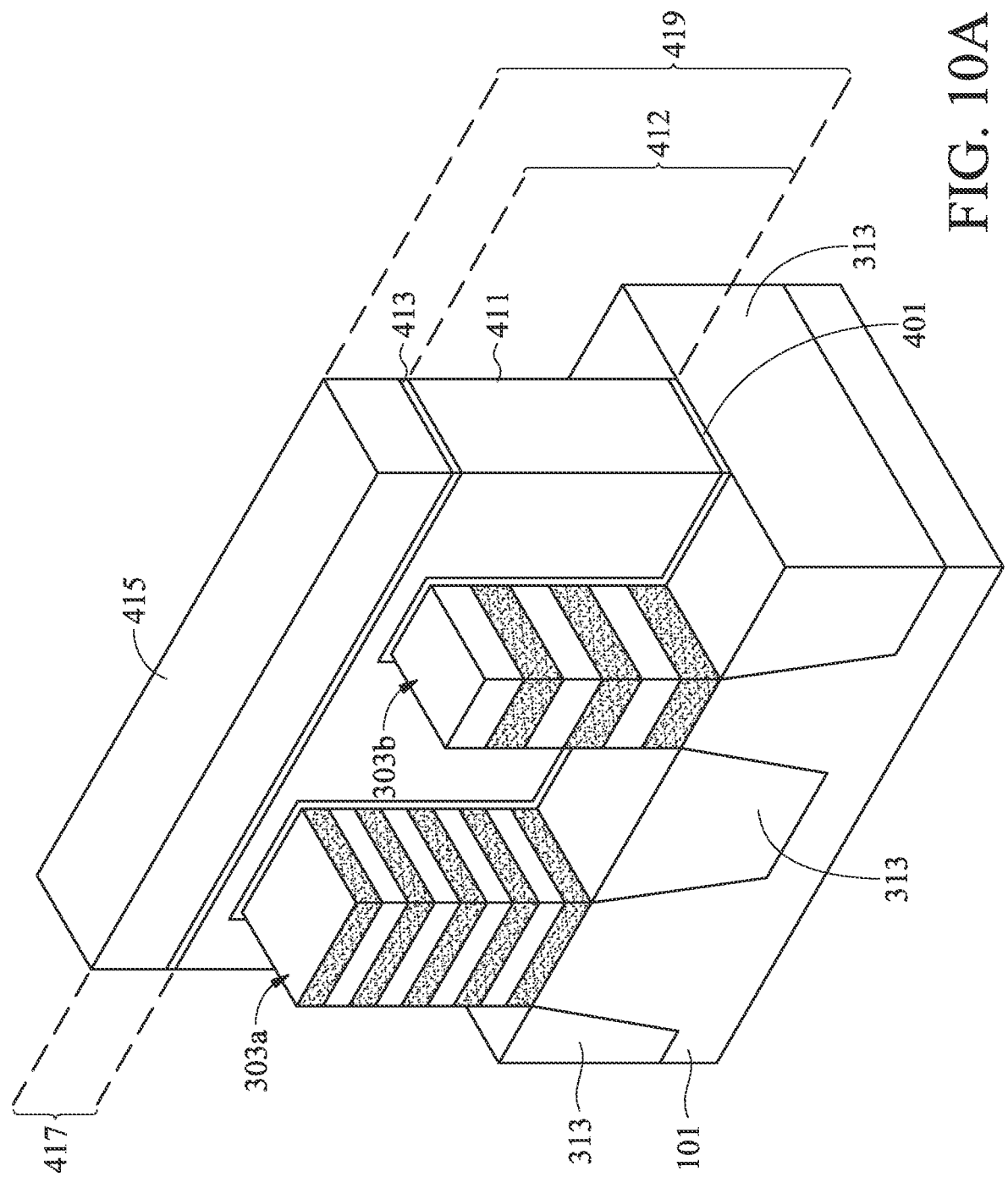
Figure 10B:
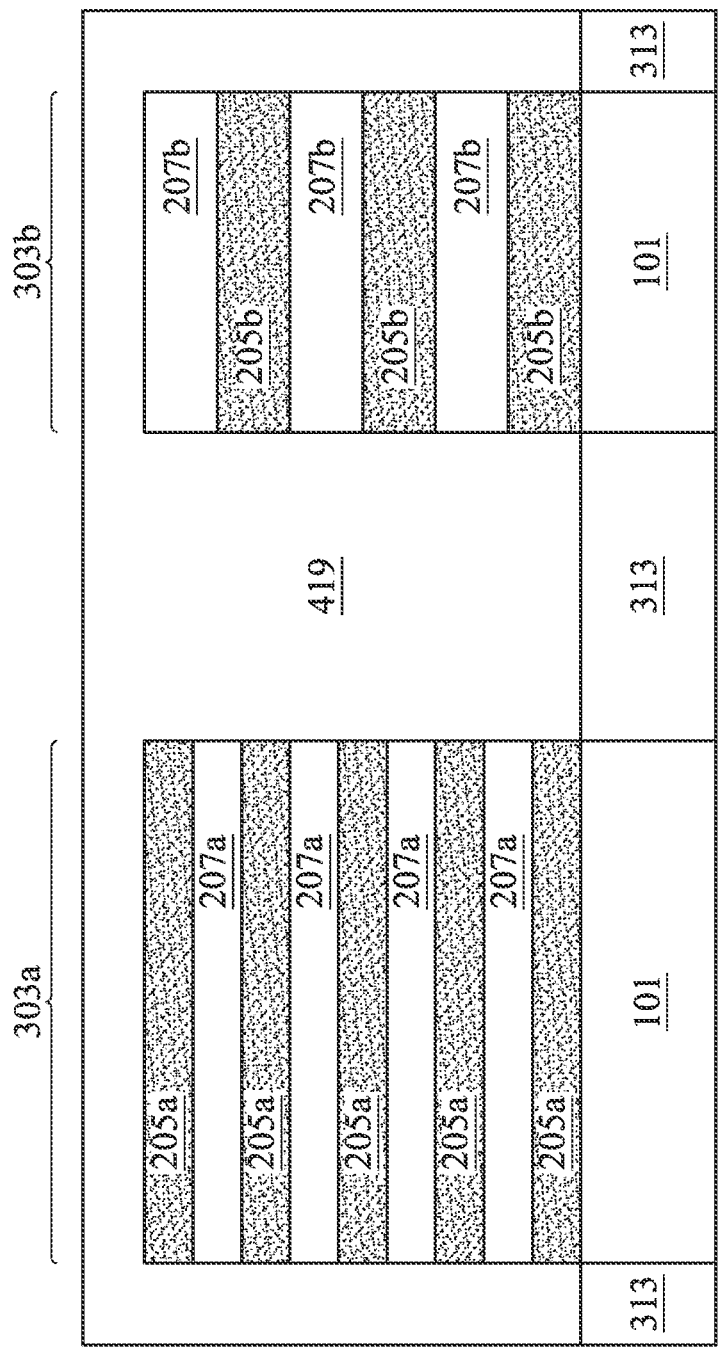

Referring to FIGS. 10A and 10B, a dummy gate metal stack 419 is formed. A dummy metal layer 411 is deposited over the dummy gate oxide layer 401 (shown in FIG. 9). In an embodiment, the dummy metal layer 411 is a conductive material and may be selected from a group comprising polycrystalline-silicon (poly-Si), poly-crystalline silicon-germanium (poly-SiGe), metallic nitrides, metallic silicides, metallic oxides, and metals. In an embodiment, the dummy metal layer 411 may be deposited by PVD, CVD, sputter deposition, or other techniques known and used in the art for depositing conductive materials. Other materials, conductive and non-conductive, may be used. The top surface of the dummy metal layer 411 may be planarized after it is deposited.

A first hardmask layer 413 is deposited over the dummy metal layer 411 through a process such as CVD, or a spin-on-glass process, although any acceptable process may be utilized. In an embodiment, the first hardmask layer 413 may be an oxide layer (e.g., silicon oxide). A second hardmask layer 415 is then deposited on the first hardmask layer 413 through a process such as CVD, or a spin-on-glass process, although any acceptable process may be utilized. The first hardmask layer 413 and the second hardmask layer 415 are patterned to form a dummy gate hardmask layer stack 417 over the dummy metal layer 411. In an embodiment, a polysilicon etch and a dummy oxide removal process are performed using the dummy gate hardmask layer stack 417 to pattern the dummy metal layer 411 and the dummy gate oxide layer 401. During patterning, portions of the dummy metal layer 411 and portions of the dummy gate oxide layer 401 are removed from source/drain areas of fins 303 and portions of the dummy metal layer 411 and portions of the dummy gate oxide layer 401 remain over a channel region of fins 303 to form a dummy metal gate electrode 412. The dummy metal gate electrode 412 includes the patterned dummy metal layer 411 and the patterned dummy gate oxide layer 401 disposed below the patterned dummy metal layer 411. The dummy metal gate electrode 412 and the dummy gate hardmask layer stack 417 collectively form the dummy metal gate stack 419.

The dummy metal gate stack 419 will be used to define and form source/drain regions from the exposed portions of fins 303. The dummy metal gate stack 419 will then be removed to allow processing to be performed to define and form channel regions from the exposed portions of fins 303, center portions of fins 303, as follows.

Figure 11:
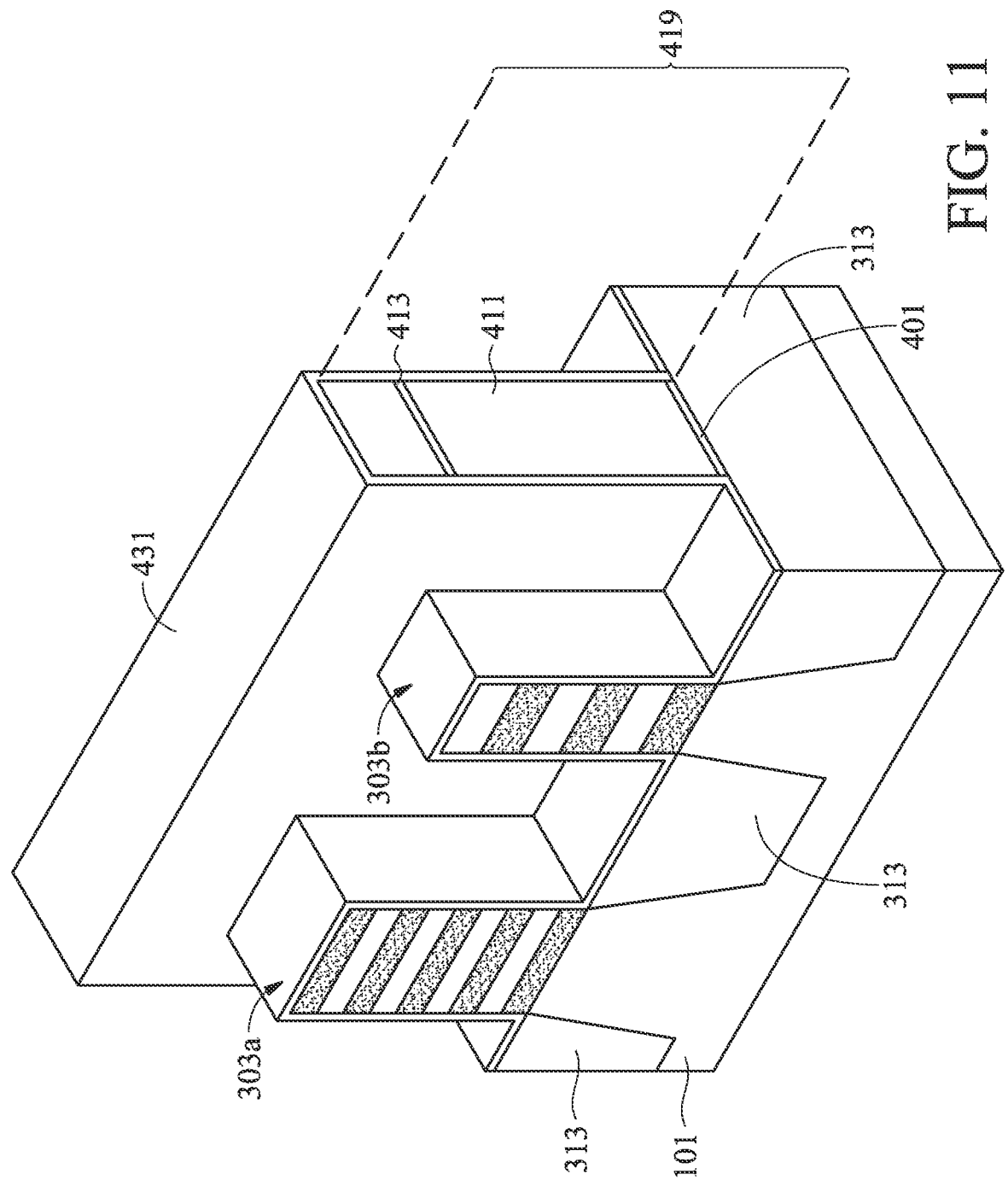

Referring now to FIG. 11, a spacer layer 431 is deposited over the dummy metal gate stack 419, the fins 303, and the upper surface of STIs 313. In an embodiment, spacer layer 431 is formed of silicon nitride (SiN), and may have a single-layer structure. In other embodiments, the spacer layer 431 may have a composite structure including a plurality of layers. For example, a silicon nitride layer may be formed over a silicon oxide layer. In an embodiment, the spacer layer 431 may be conformally formed on the epitaxial source/drain regions of fins 303, both sidewalls and upper surface of the dummy metal gate stack 419 and the upper surface of the STIs 313. In an embodiment, the spacer layer 431 may be formed using atomic layer deposition (ALD), chemical vapor deposition (CVD), or the like, or a combination thereof.

Figure 12A:
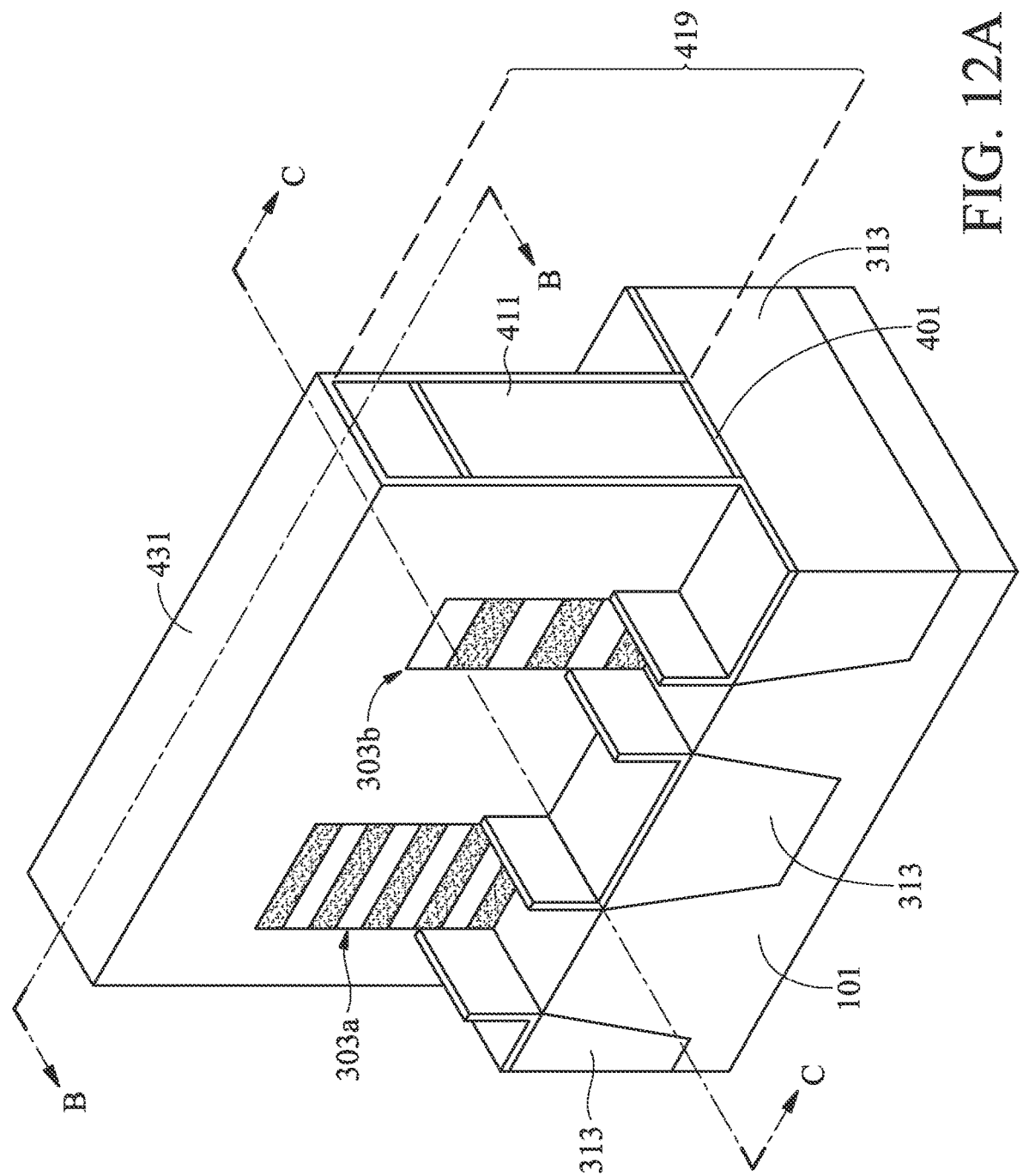
Figure 12B:
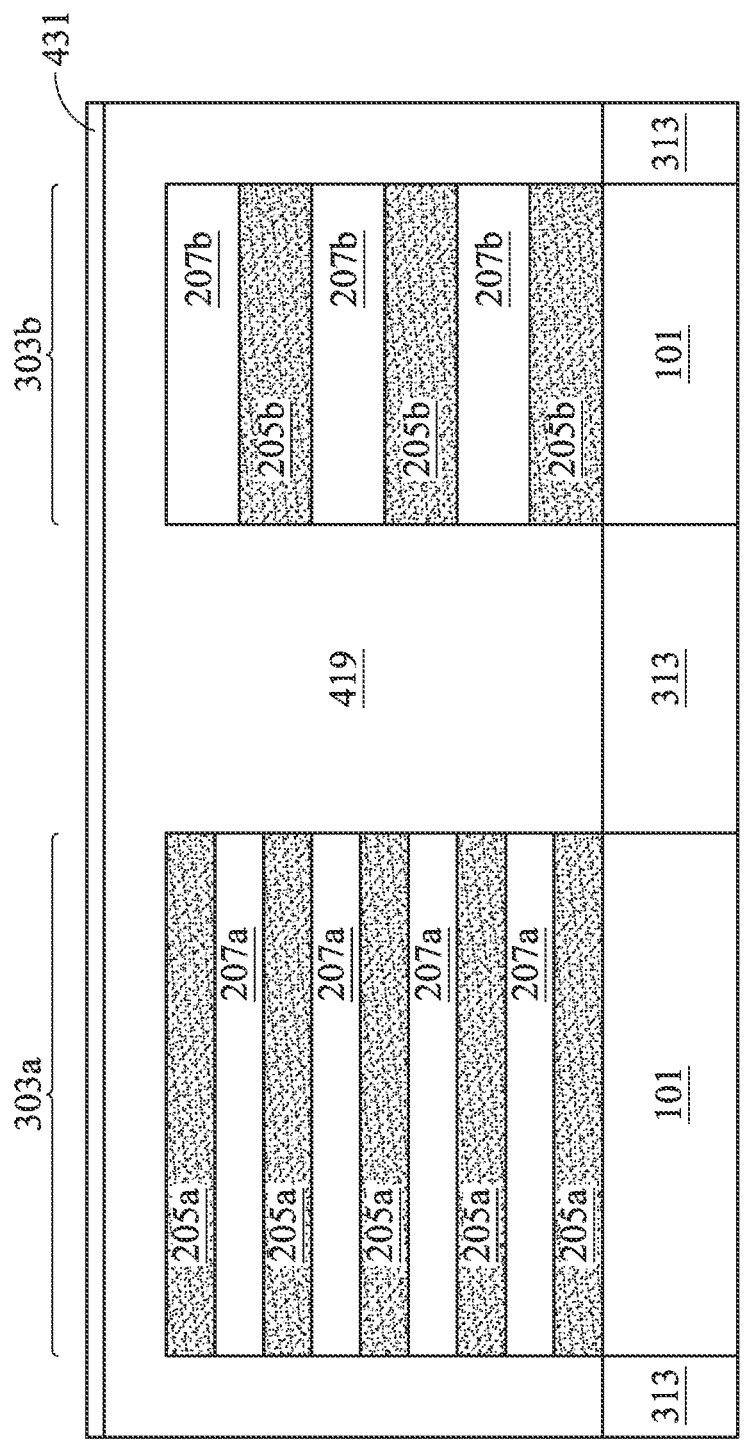
Figure 12C:
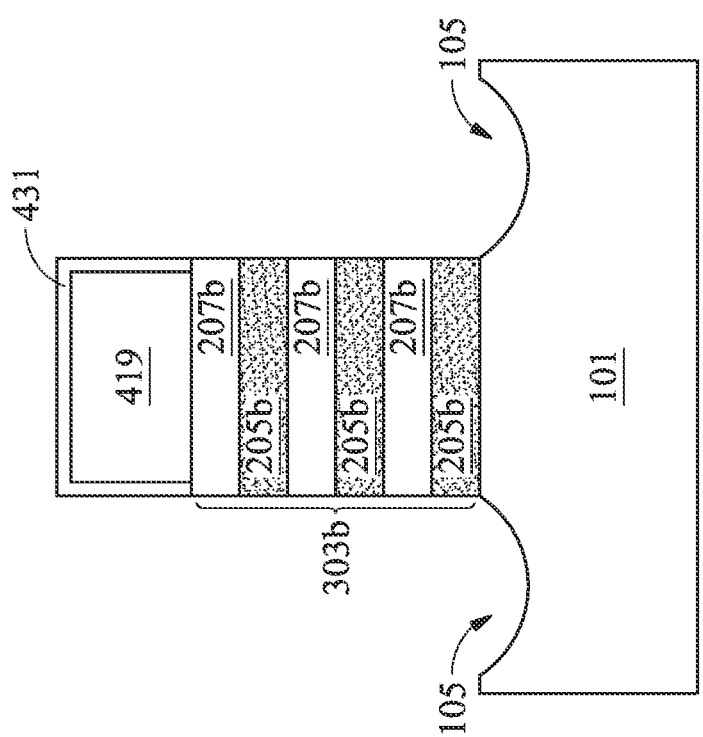

Next, FIGS. 12A, 12B and 12C illustrate the performing of an anisotropic etching process to remove portions of the spacer layer 431 and portions of the fins 303 (e.g., 303a and 303b). The anisotropic etching process may be performed using the dummy metal gate stack 419 as an etching mask. After the anisotropic etching, sidewalls of the spacer layer 431 are aligned with respective sidewalls of the fins 303, due to the anisotropic etching, in some embodiments. FIG. 12C is illustrated along cross-section C-C as shown in FIG. 12A, passing through fin 303b perpendicular to the dummy metal gate stack 419. Figures illustrated along cross-section C-C represent processes and structures performed on all fins 303, using 303b as an example. As illustrated in FIG. 12C, the anisotropic etch may also etch recesses 105 into the upper surface of substrate 101 on either side of the fins 303.

Figure 13:
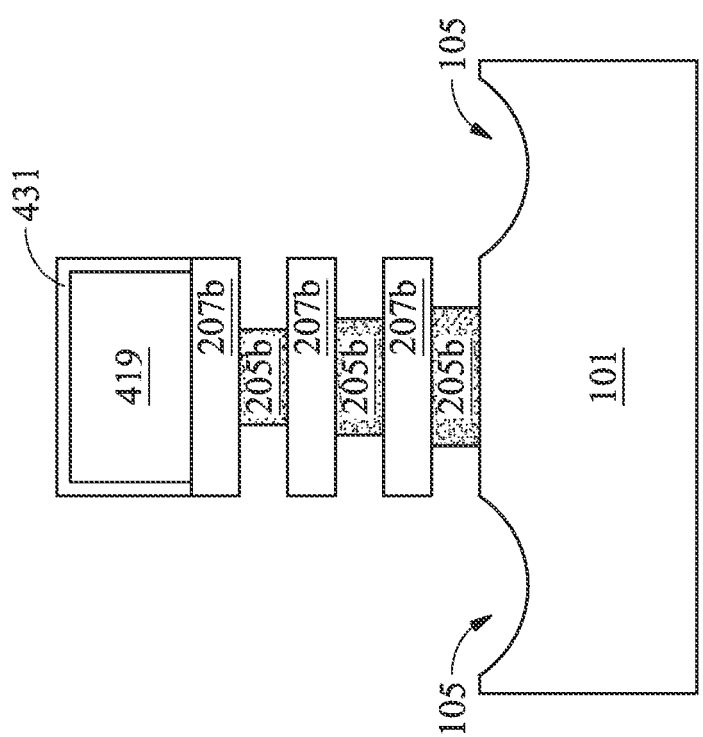

Next, in FIG. 13, illustrated along cross-section C-C as shown in FIG. 12A, a lateral selective etching process is performed to recess exposed portions of the first semiconductor material. The lateral selective etching process may be performed using an etchant that is selective to the first semiconductor material, as described below in the discussion of FIGS. 19A, 19B, and 19C. In the example of FIG. 13, the first semiconductor layer 205 is formed of the first semiconductor material (e.g., SiGe), and therefore, the lateral selective etch recesses the first semiconductor layers 205.

Figure 14:
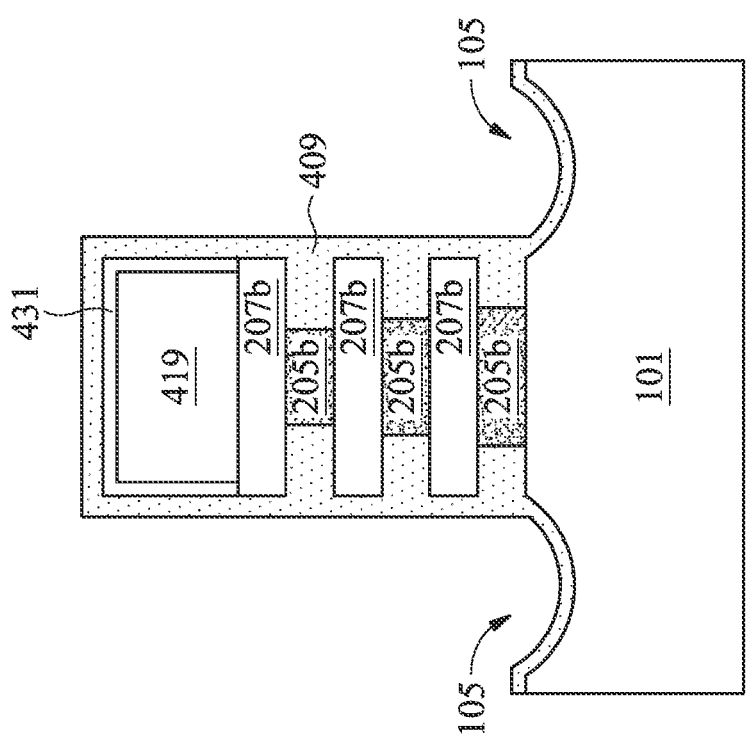

Next, in FIG. 14, illustrated along cross-section C-C as shown in FIG. 12A, a dielectric material 409 is formed to fill the space left by the removal (e.g., recess) of the first semiconductor material from exposed portions of first semiconductor layers 205 discussed above with reference to FIG. 13. The dielectric material 409 may be a low-K dielectric material, such as $SiO_2$, SiN, SiCN, or SiOCN, and may be formed by a suitable deposition method, such as ALD.

Figure 15:
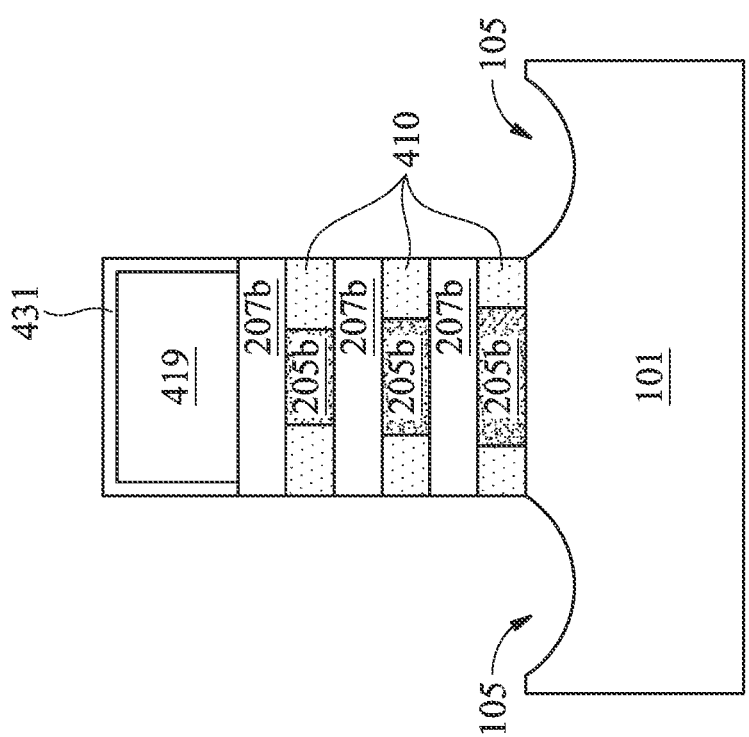

Next, in FIG. 15, illustrated along cross-section C-C as shown in FIG. 12A, after the deposition of the dielectric material 409, an anisotropic etching process may be performed to trim the deposited dielectric material 409, such that only portions of the deposited dielectric material 409 that fill the space left by the removal of the first semiconductor material from the first semiconductor layers 205 are left. After the trimming process, the remaining portions of the deposited dielectric material 409 form inner spacers 410. The inner spacers 410 serve to isolate metal gates from source/drain regions formed in subsequent processing. In the example of FIG. 15, sidewalls of the inner spacers 410 are aligned with sidewalls of the second semiconductor layers 207.

Figure 16:
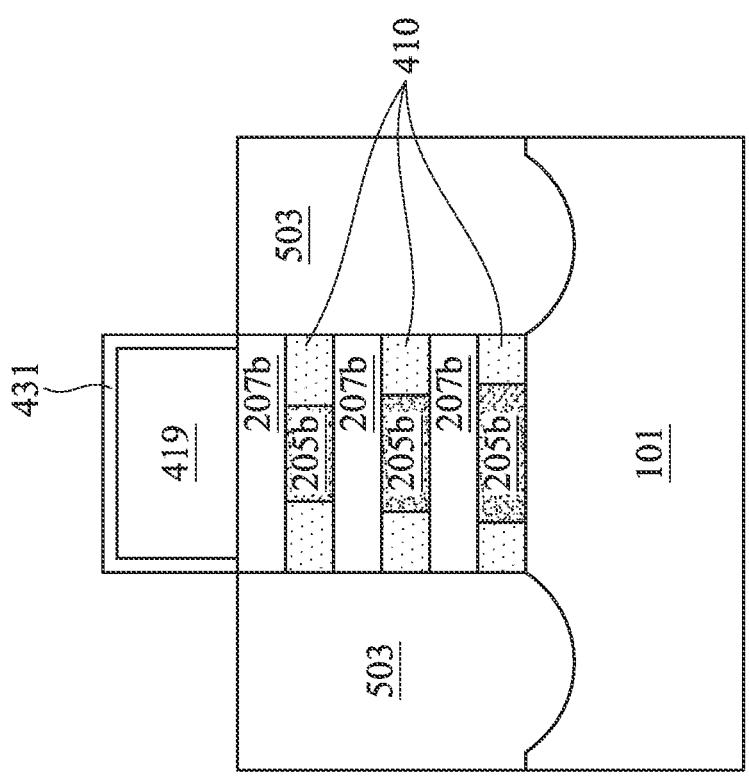

Next, in FIG. 16, illustrated along cross-section C-C as shown in FIG. 12A, source/drain regions 503 are formed in recesses 105 of the substrate 101. The source/drain regions 503 are formed by epitaxially growing a material in the recesses 105, using suitable methods such as metal-organic CVD (MOCVD), molecular beam epitaxy (MBE), liquid phase epitaxy (LPE), vapor phase epitaxy (VPE), selective epitaxial growth (SEG), the like, or a combination thereof. The epitaxial source/drain regions 503 fill the spaces between adjacent fins 303. The epitaxial source/drain regions 503 may have surfaces raised from surfaces of the fins 303 and may have facets. In some embodiments, adjacent source/drain regions 503 may merge to form a continuous epitaxial source/drain region 133. As illustrated below in FIG. 17, adjacent source/drain regions 503 do not merge together and remain separate source/drain regions 503. The material(s) of the source/drain regions 133 may be tuned in accordance with the type of devices to be formed. In some embodiments, the resulting GAA FET is an n-type FinFET, and source/drain regions 503 comprise silicon carbide (SiC), silicon phosphorous (SiP), phosphorous-doped silicon carbon (SiCP), or the like. In some embodiments, the resulting GAA FET is a p-type FinFET, and source/drain regions 503 comprise SiGe, and a p-type impurity such as boron or indium.

The epitaxial source/drain regions 503 may be implanted with dopants followed by an anneal process. The implanting process may include forming and patterning masks such as a photoresist to cover the regions of the GAA FET device that are to be protected from the implanting process. The source/drain regions 503 may have an impurity (e.g., dopant) concentration in a range from about 1E19 $cm^{-3}$ to about 1E21 $cm^{-3}$. P-type impurities, such as boron or indium, may be implanted in the source/drain region 503 of a P-type transistor. N-type impurities, such as phosphorous or arsenide, may be implanted in the source/drain regions 503 of an N-type transistor. In some embodiments, the epitaxial source/drain regions may be in situ doped during growth.

Figure 17:
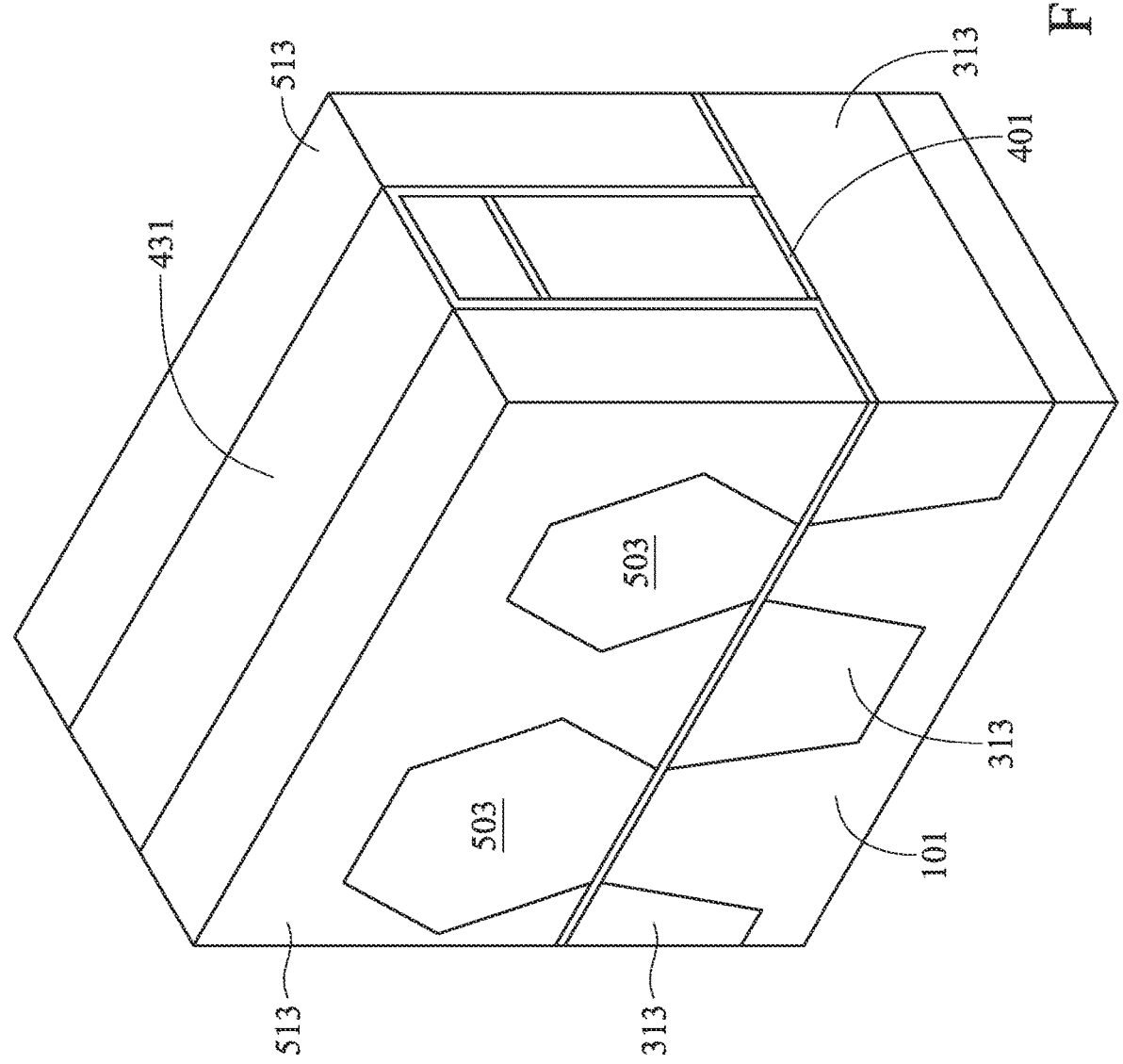

Next, in FIG. 17, illustrated in a 3D view, an interlayer dielectric (ILD) 513 is formed over the epitaxial source-drain regions 503. Prior to forming the ILD 513, a contact etch stop layer (CESL) may be formed (not illustrated) over the epitaxial source-drain regions 503. The CESL may function as an etch stop layer in a subsequent etching process, and may comprise a suitable material such as silicon oxide, silicon nitride, silicon oxynitride, combinations thereof, or the like, and may be formed by a suitable formation method such as CVD, PVD, combinations thereof, or the like. The ILD 513 is formed over the CESL and the epitaxial source/drain regions 503 on both sides of dummy metal gate stack 419. In some embodiments, the ILD 513 may comprise a dielectric material such as silicon oxide, phosphosilicate glass (PSG), borosilicate glass (BSG), boron-doped phosphosilicate Glass (BPSG), undoped silicate glass (USG), or the like, and may be deposited by any suitable method, such as CVD, PECVD, FCVD, or a high density plasma (HDP). Subsequently, the ILD 513 may be planarized to be substantially coplanar with top surfaces of the dummy metal gate stack 419 (shown in FIG. 17), exposing the top surface of the dummy metal gate stack 419. In an embodiment, the ILD 513 may be planarized by using, for example, a CMP to remove portions of the ILD 513. In other embodiments, other planarization techniques may be used, such as etching.

Figure 18A:
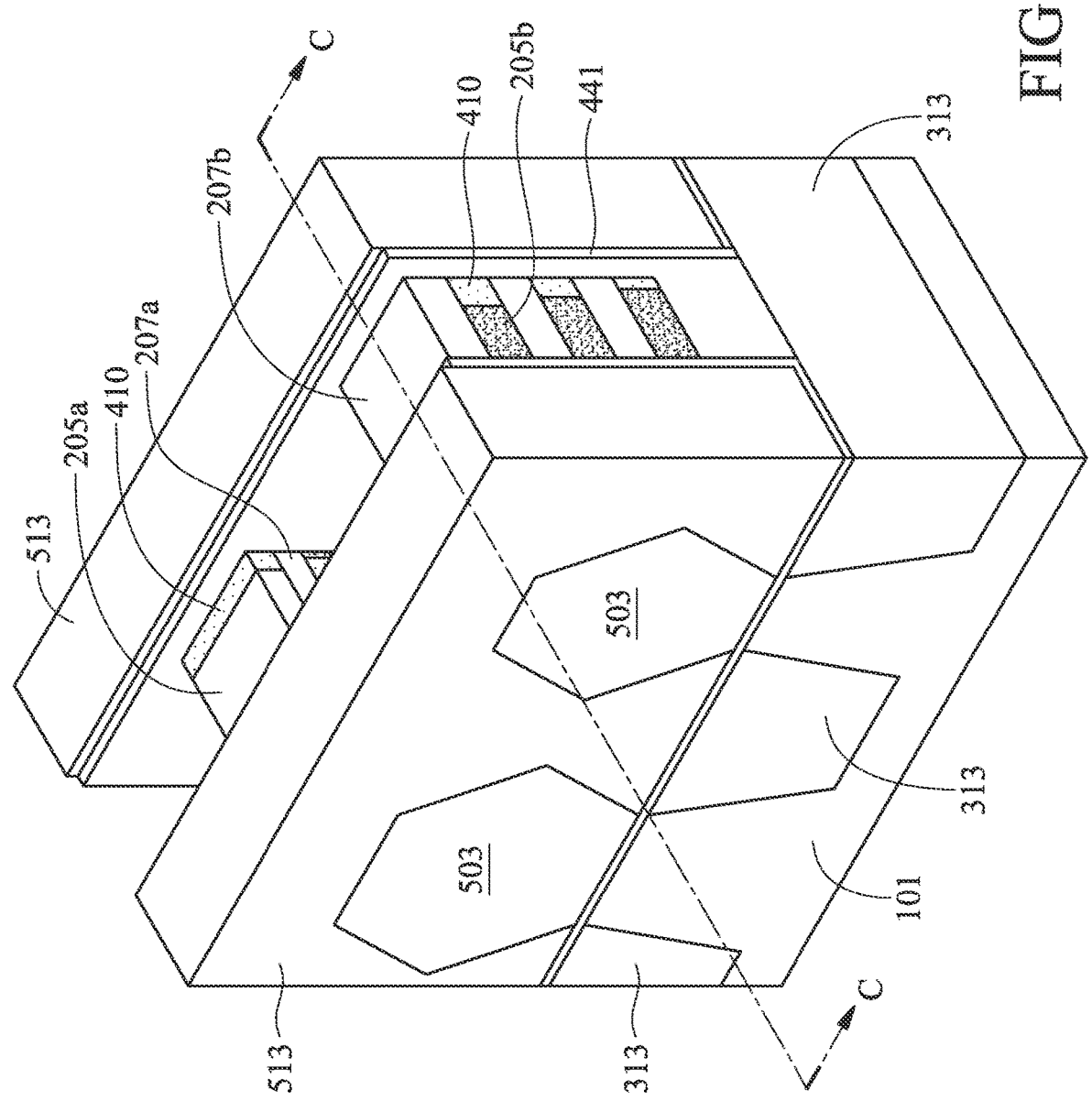
Figure 18B:
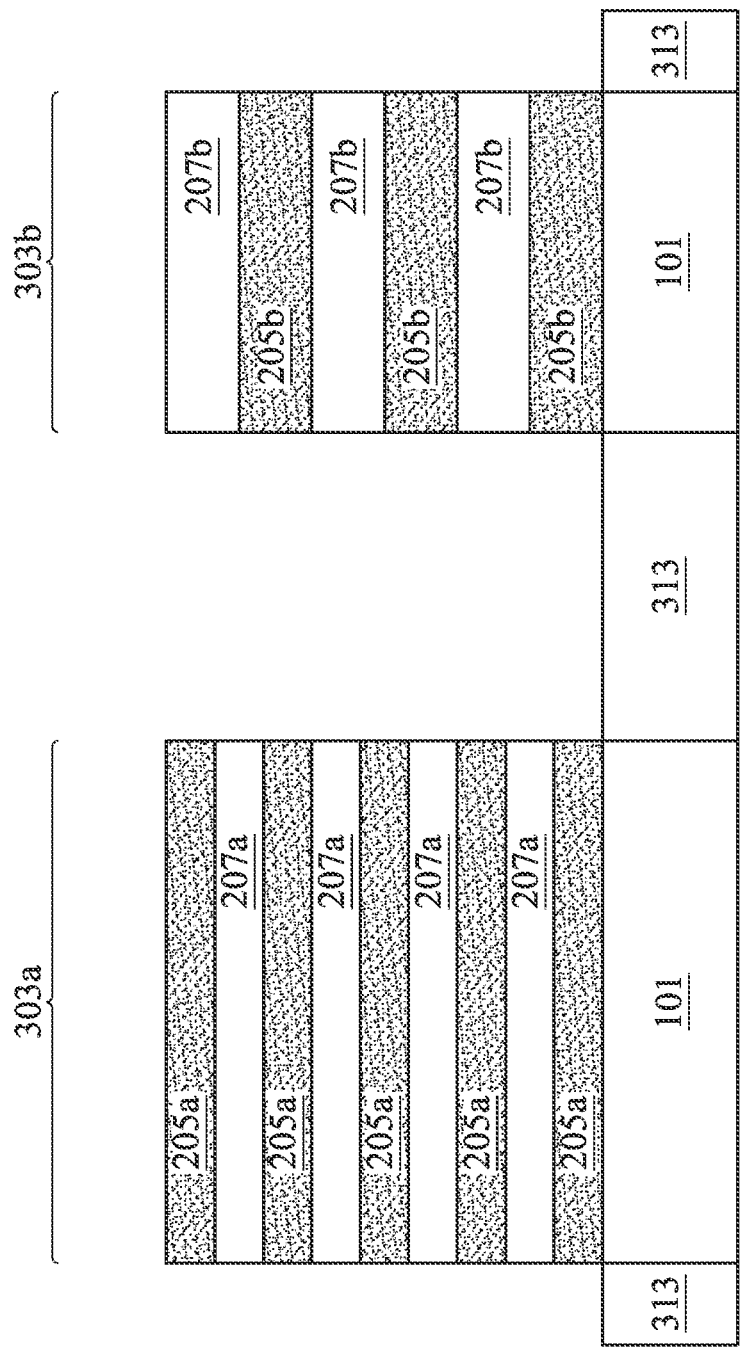
Figure 18C:
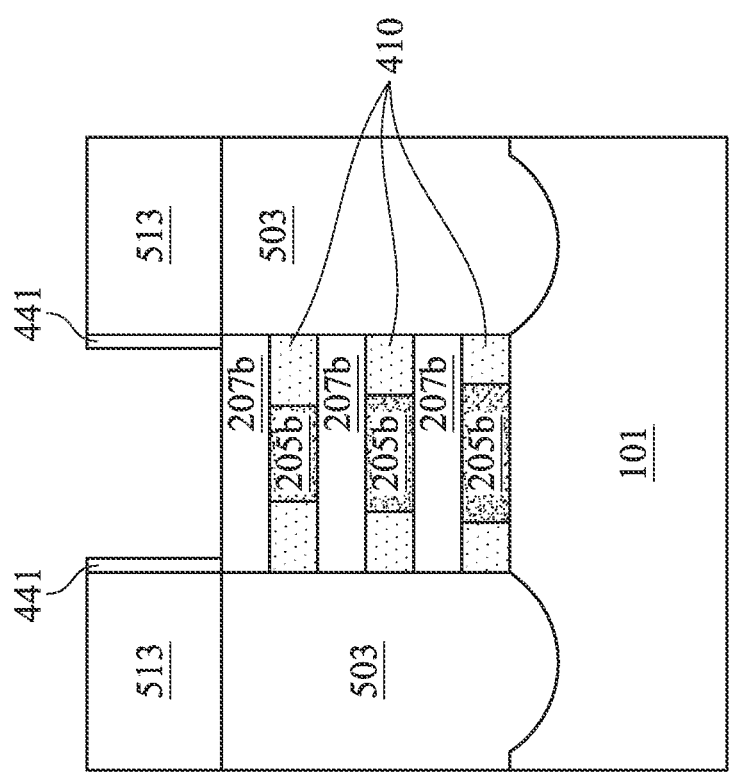

In FIGS. 18A, 18B, and 18C, once the ILD 513 is formed over the epitaxial source/drain regions 503 and the top surface of the dummy metal gate stack 419 is exposed, the dummy metal gate electrode 412 and the dummy gate hardmask layer stack 417 (shown in FIG. 10A) are removed in one or more etching step(s). The etching step(s) may be selective to the materials of the dummy metal gate electrode 412 and dummy gate oxide layer 401, which etching may be a dry or wet etching. During the etching of the dummy metal gate electrode 412, the dummy gate oxide layer 401 may be used as an etch stop layer. The dummy gate oxide layer 401 may then be etched after removal of the dummy metal gate electrode 412. An opening is formed between the source/drain regions 503 covered by the ILD 513 and a channel region of the patterned fins 303 is exposed. Portions of the spacer layer 431 remain along sidewalls of the ILD 513, forming sidewall spacers 441.

Figure 19A:
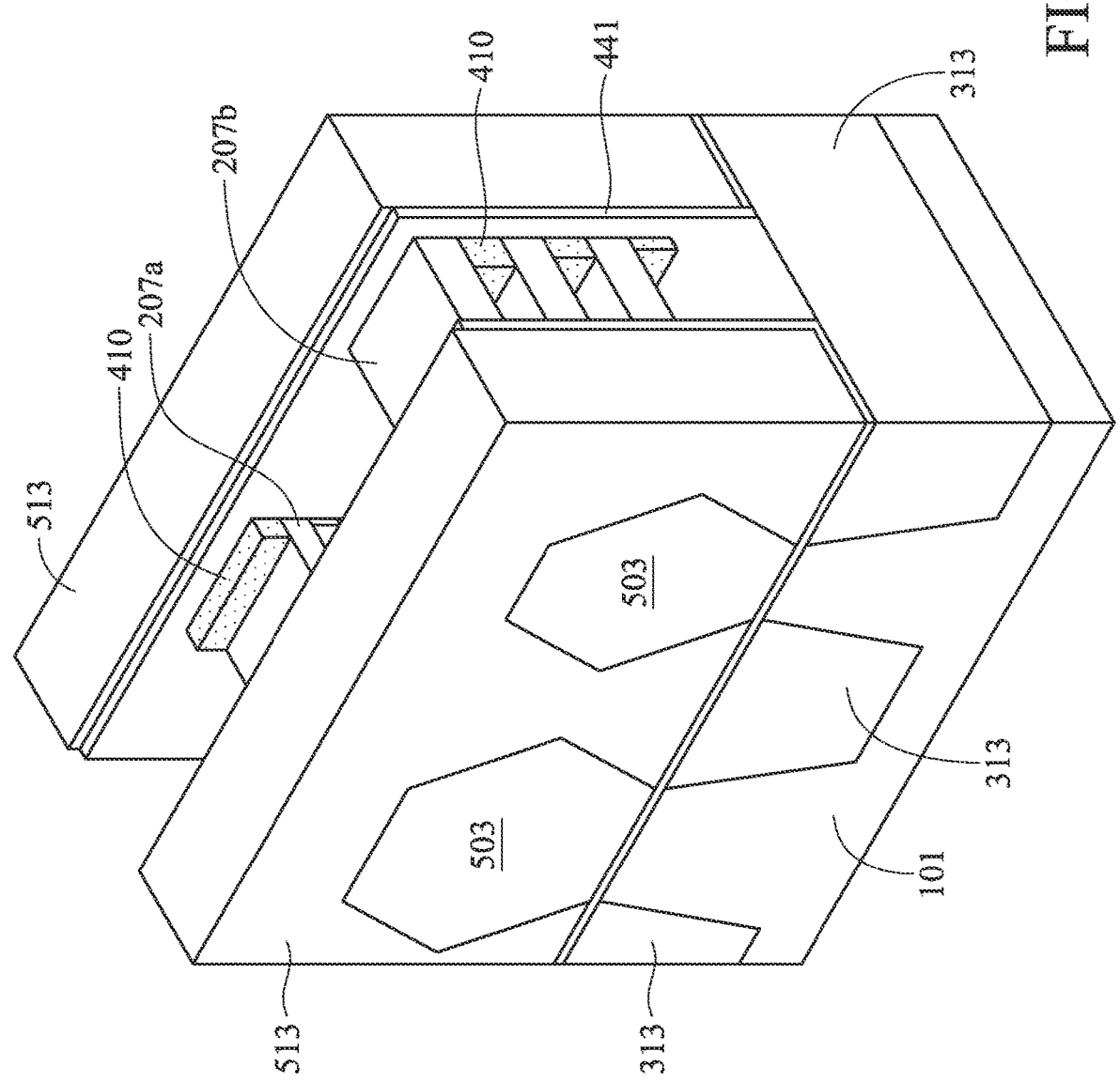
Figure 19B:
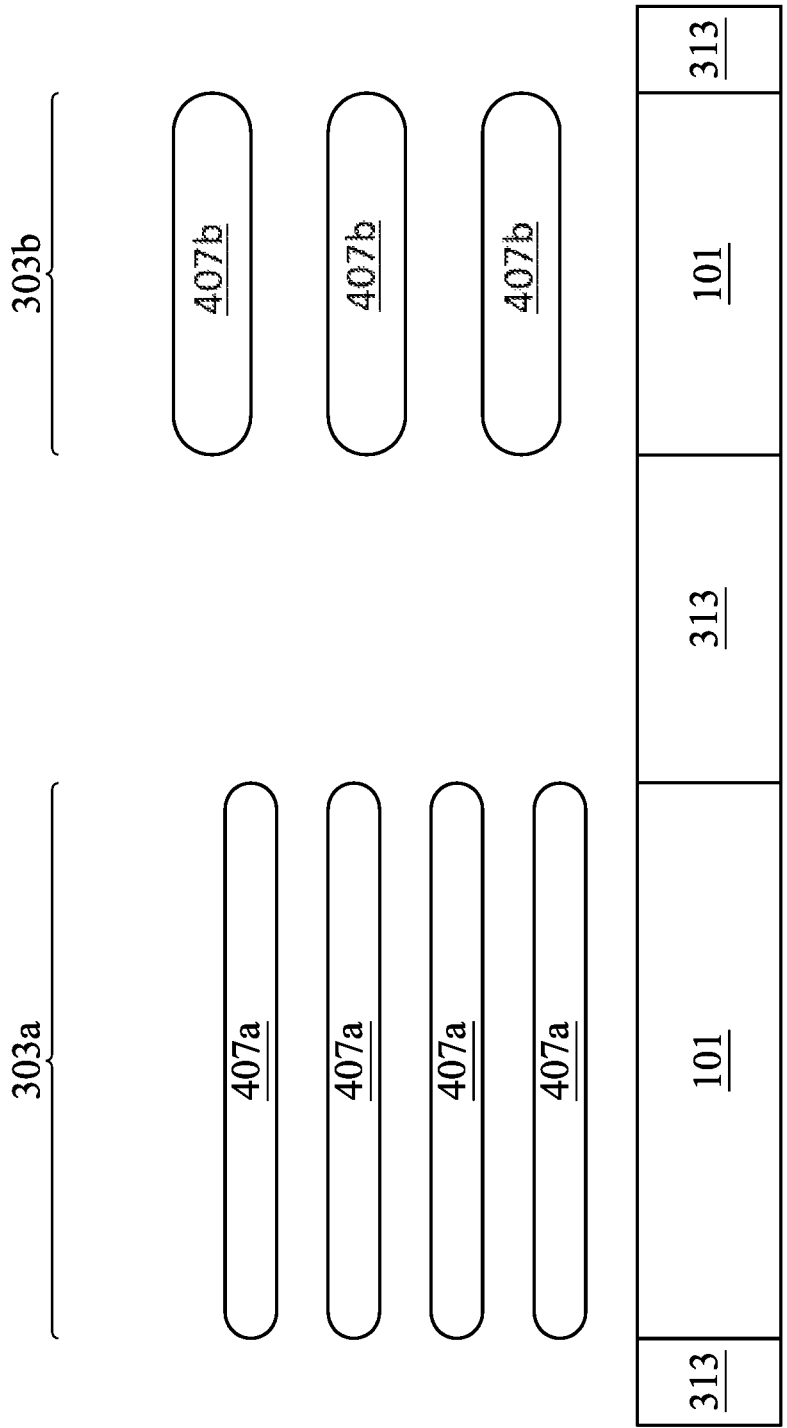
Figure 19C:
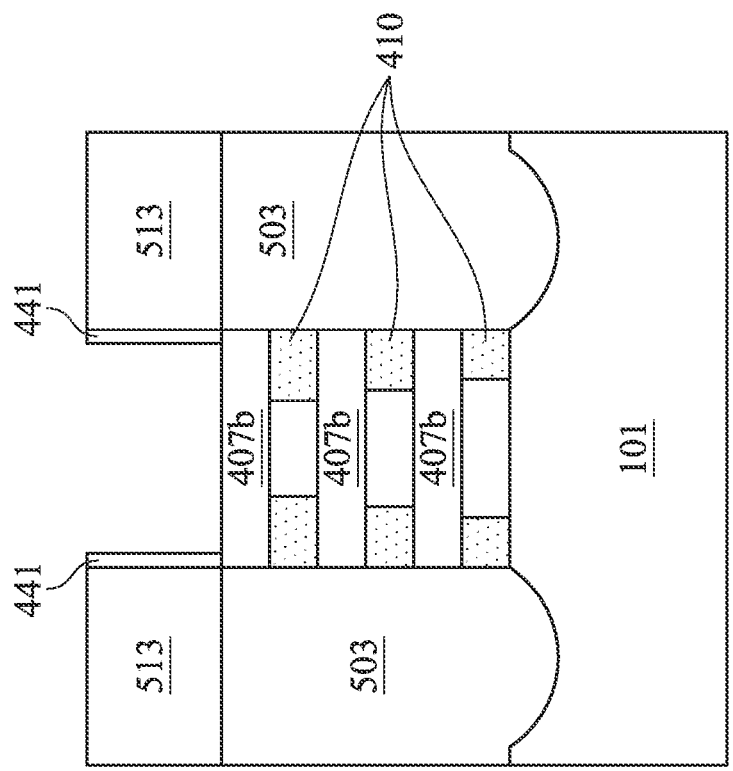

In FIGS. 19A, 19B, and 19C, the exposed channel region portions of the fins 303 are processed to remove the first semiconductor layers 205. A selective removal process for the first semiconductor layers 205 (e.g., SiGe layers) is performed in the channel region portions of the fins 303. In an embodiment in which the first semiconductor layers 205a and 205b are formed of silicon germanium (SiGe) and the second semiconductor layers 207a and 207b are formed of silicon (Si), the first semiconductor layers 205a and 205b may be removed, for example, by an NMOS SiGe selective removal process. In some embodiments, the selective removal process may use an etchant that selectively etches the silicon germanium at a higher rate than the silicon, such as $NH_4OH:H_2O_2:H_2O$ (ammonia peroxide mixture, APM), $H_2SO_4+H_2O_2$ (sulfuric acid peroxide mixture, SPM), or the like. Other suitable processes and materials may be used. This selective etching process removes the first semiconductor layers 205a and 205b (e.g., SiGe layers).

Furthermore, while not specifically illustrated, it is to be understood that an NFET device may be formed in the channel region from any one of the fins 303 or a PFET device may be formed in the channel region from any one of the fins 303. While not specifically illustrated, it is also to be understood that an NFET device may be formed in a channel region from one of the fins 303 and a PFET device may be formed in a channel region from the other one of the fins 303. For example, in an embodiment in which two NFET devices are formed, the selectively removed first semiconductor layers 205a and 205b may comprise SiGe, the remaining second semiconductor layers 207a and 207b may comprise Si, and source/drain regions 503 may comprise silicon carbide (SiC), silicon phosphorous (SiP), phosphorous-doped silicon carbon (SiCP), or the like. In another embodiment in which two PFET devices are formed, the selectively removed first semiconductor layers 205a and 205b may comprise Si, the remaining second semiconductor layers 207a and 207b may comprise SiGe, and source/drain regions 503 comprise SiGe and a p-type impurity such as boron or indium. In other embodiments in which two PFETs may be formed, the selectively removed first semiconductor layers 205a and 205b may comprise SiGe, the remaining second semiconductor layers 207a and 207b may comprise Si, and source/drain regions 503 comprise SiGe and a p-type impurity such as boron or indium.

After the selective removal of the first semiconductor layers 205a and 205b, the second semiconductor layers 207a and 207b remain in fins 303 and are referred to herein as a first stack of nanosheets 407a and a second stack of nanosheets 407b, respectively. GAA transistor devices using the nanosheet structures can be logic devices, static random access memory (SRAM) devices, IO devices, electro-static discharge (ESD) devices, or passive devices. In another embodiment, after etching, bottom-most first semiconductor layers 205a and 205b (e.g., SiGe layers) may remain below the upper surface of the STIs 313 as a stress layer within the fins 303a and 303b to provide certain strains or relaxations of the fin materials.

In an embodiment in which the first semiconductor layers 205a and 205b (e.g., SiGe layers) are formed of silicon germanium (SiGe) and the second semiconductor layers 207a and 207b (e.g., Si layers) are formed of silicon (Si), the second semiconductor layers 207a and 207b (e.g., Si layers) may be removed, for example, by a Si removal process. In some embodiments, the removal process may use a wet etch using a tetramethylammonium hydroxide (TMAH) solution, or the like. Other processes and materials may be used. This etching process removes the second semiconductor layers 207a and 207b. Thus, second nanosheets 405a and 405b (not specifically shown) are formed from fins 303.

Figure 20A:
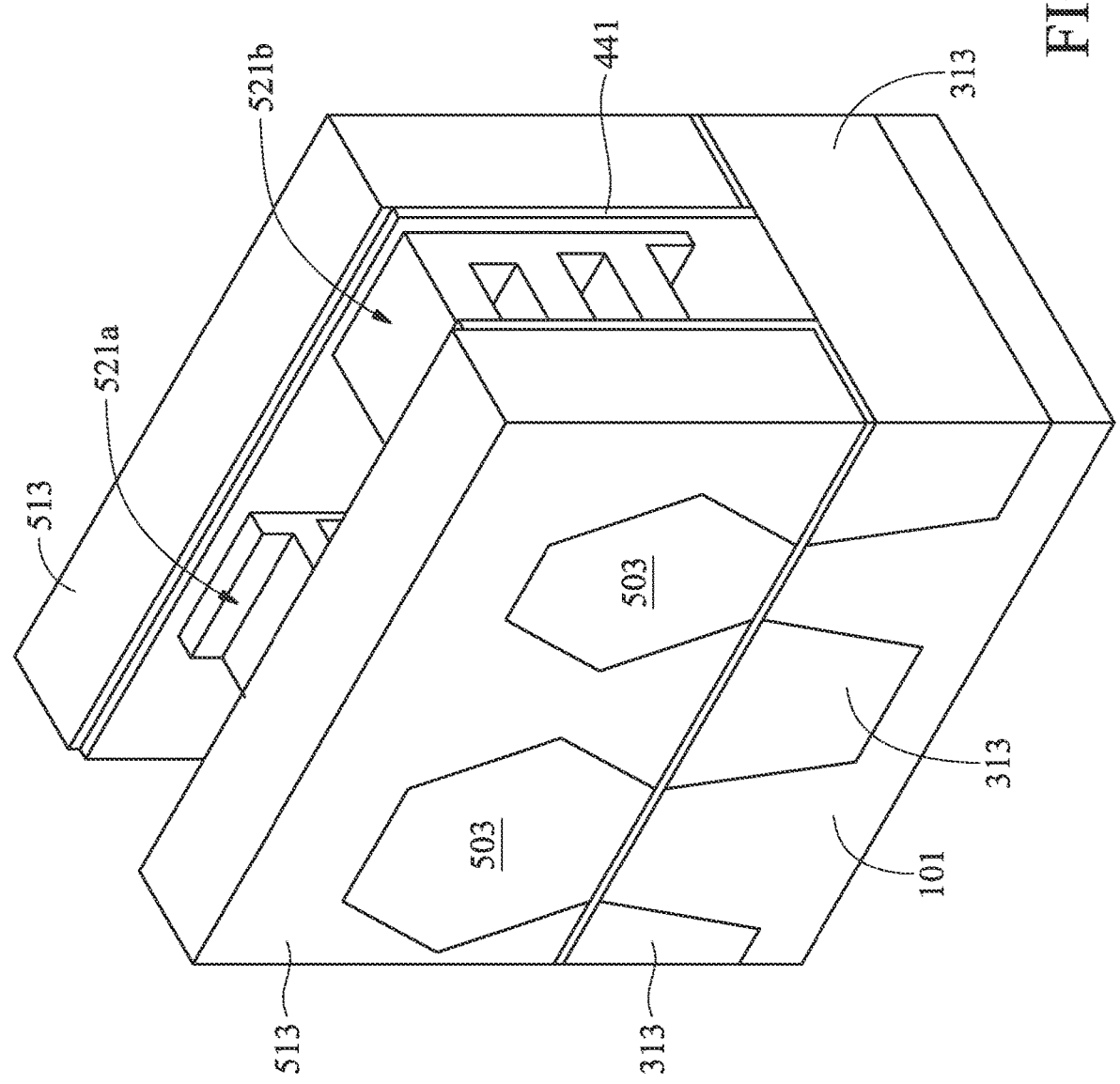
Figure 20B:
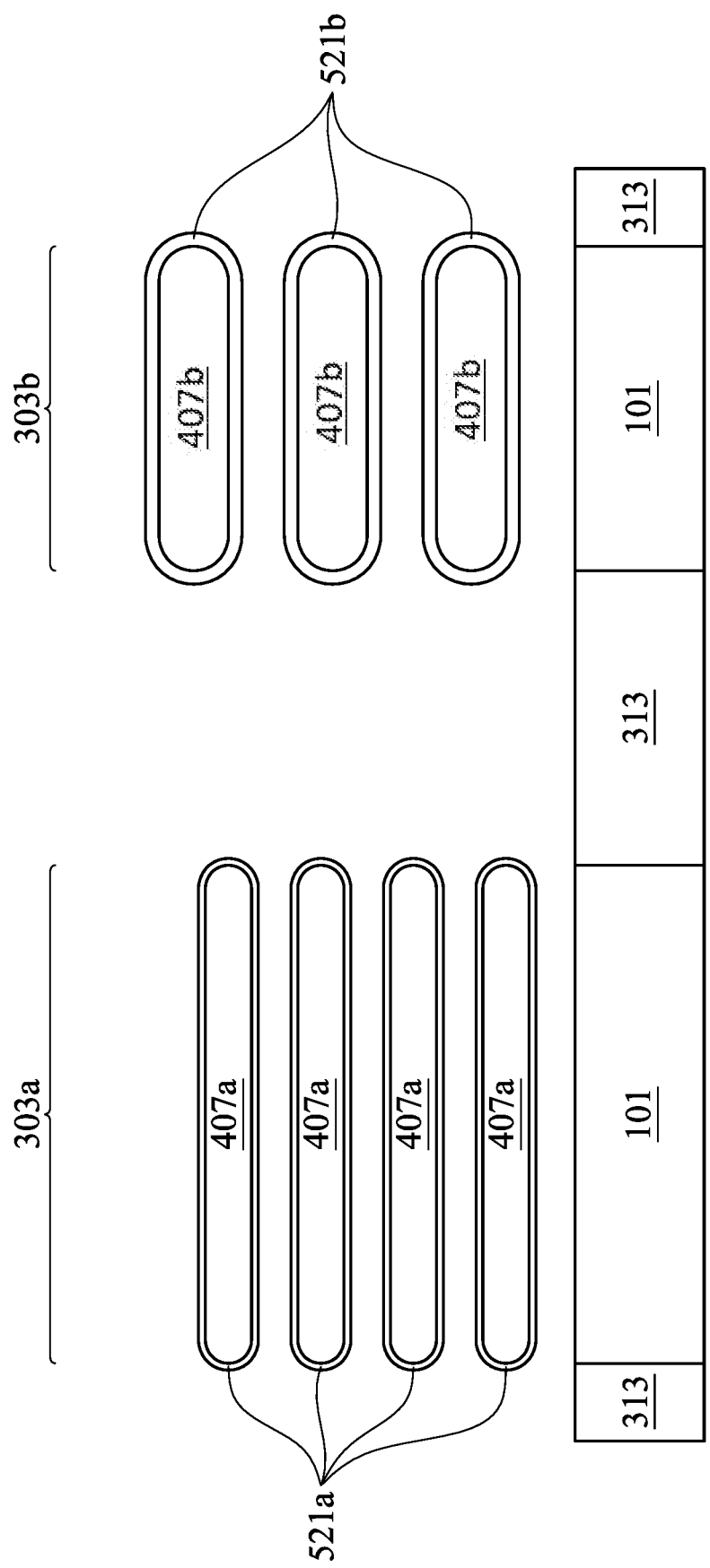
Figure 20C:
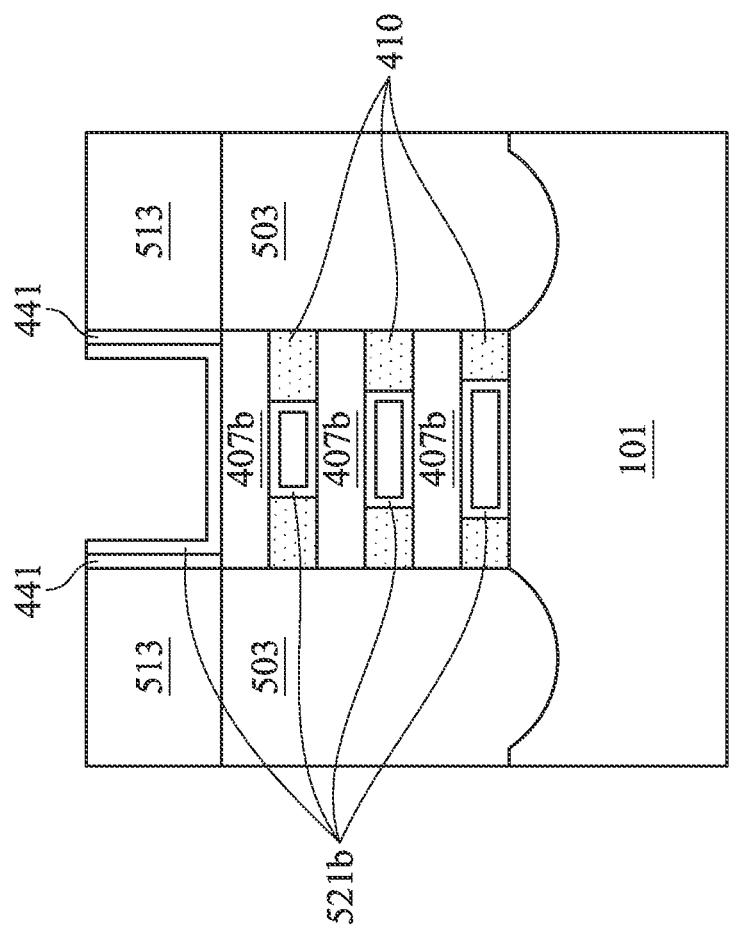

In FIGS. 20A, 20B, and 20C, a first gate dielectric 521a and a second gate dielectric 521b are formed over the exposed portions of the first nanosheets 407a and the second nanosheets 407b in the space vacated by the removal of the dummy metal gate stack 419. In an embodiment, the first and second gate dielectrics 521a and 521b (hence referred to collectively as the gate dielectrics 521) may comprise a layer of interfacial dielectric overlaid with a high-k dielectric layer. The interfacial dielectrics may be, for example, oxides or the like formed by thermal oxidation, ALD, CVD, or the like. The high-k dielectric layer may have a k value greater than about 7.0. The high-k dielectric layer may include a metal oxide or a silicate of Hf, Al, Zr, La, Mg, Ba, Ti, Pb, and combinations thereof. The formation methods of the high-k dielectric layer may include ALD, CVD, Molecular-Beam Deposition (MBD), the like, or a combination thereof. Other embodiments contemplate other materials for the gate dielectrics 521, such as materials that are not high-k. As illustrated in FIG. 20C, the gate dielectrics 521 cover the surfaces of nanosheets 407 and inner spacers 410 exposed by the removal of the first semiconductor layers 205 in FIG. 19C.

First and second gate dielectrics 521a and 521b may be formed to have different respective thicknesses, as illustrated in FIG. 20B. Thicker gate dielectrics are useful for nanosheets in IO devices. Core devices may use thinner gate dielectrics with smaller spacing between adjacent nanosheets, which may prevent degradation of the core devices by larger capacitance. In an embodiment, the relative average thicknesses of the first and second gate dielectrics 521a and 521b is determined by modulating the reactant gas flow rate, the growth temperature, or the time length of the periods of deposition for the gate dielectrics. The second gate dielectric 521b may have a second gate dielectric thickness greater than a first gate dielectric thickness of the first gate dielectric 521a. An average thickness of the first gate dielectric 521a may be between about 1 nm to about 5 nm, and an average thickness of the second gate dielectric 521b may be between about 2.5 nm to about 7 nm.

First and second gate dielectrics 521a and 521b may also be formed to have different compositions. For example, the first gate dielectric 521a may comprise $SiO_2$, $SiON$, $Si_3N_4$, $HfO_x$, $LaO_x$, and/or $AlO_x$ and the second gate dielectric 521b may comprise a varied ratio of $SiO_2$, $SiON$, $Si_3N_4$, $HfO_x$, $LaO_x$, and/or $AlO_x$ from the first gate dielectric 521a.

Figure 21A:
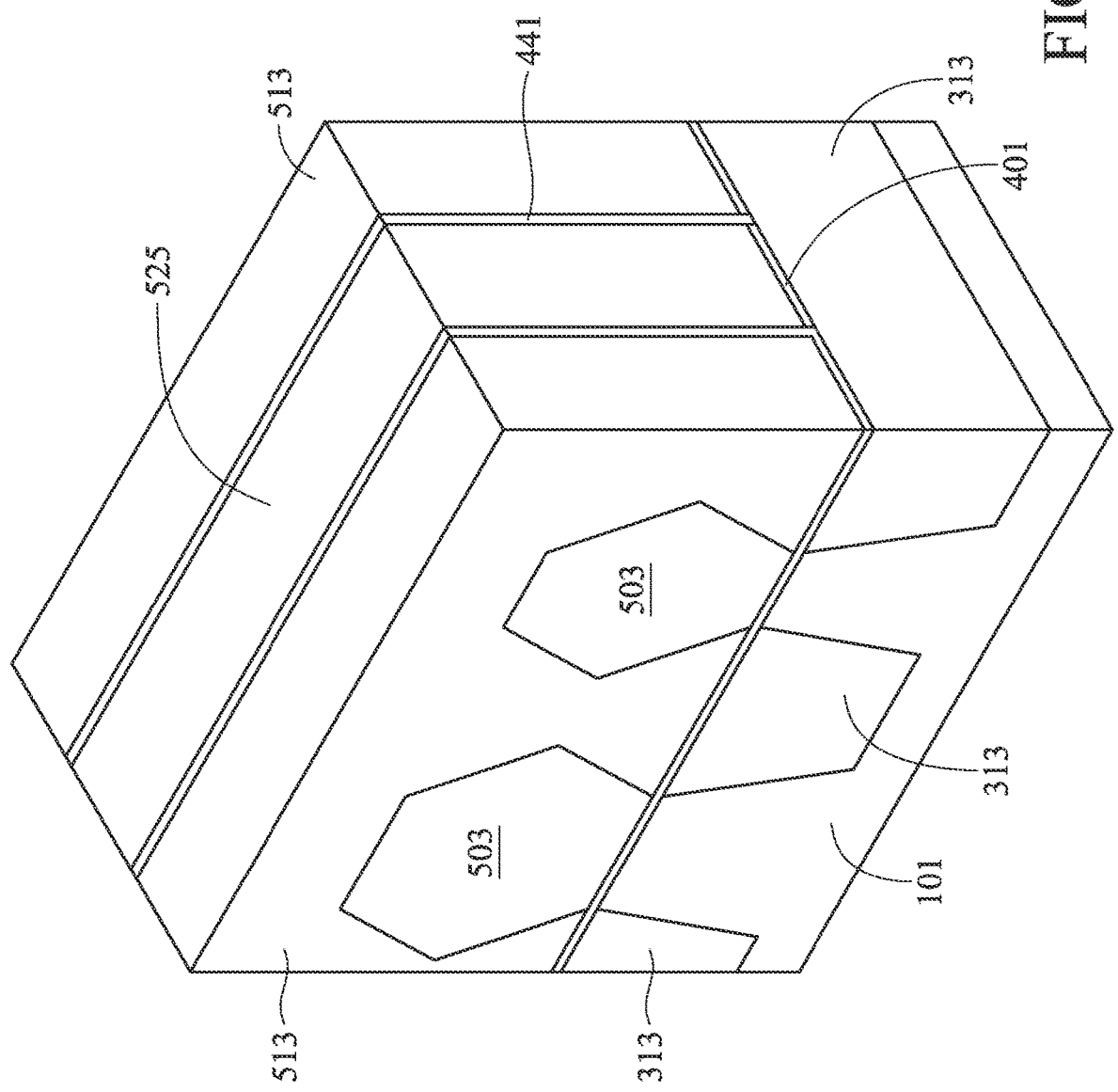
Figure 21B:
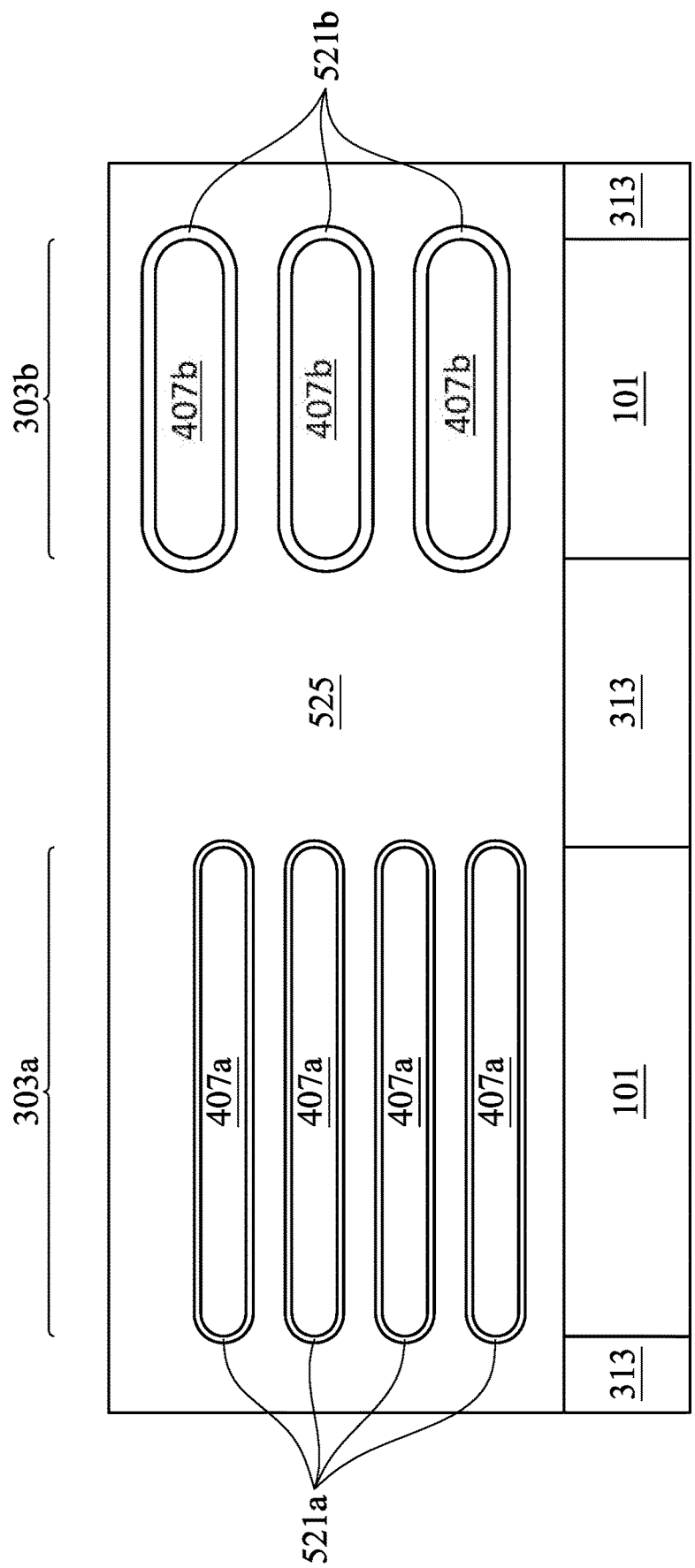
Figure 21C:
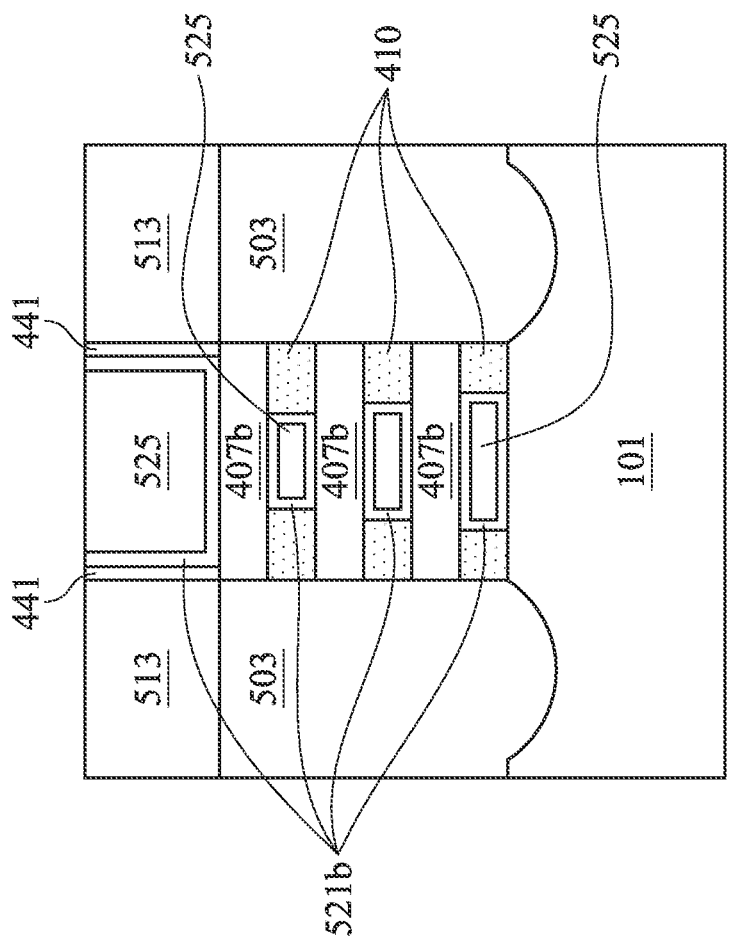

In FIGS. 21A, 21B, and 21C, a metal gate structure 525 is formed on the gate dielectrics 521 to form a metal gate electrode. The metal gate structure 525 can be a multi-layered structure. For example, the metal gate structure 525 can include a capping layer conformally formed on the gate dielectric, one or more work function tuning layers conformally formed on the capping layer, and a metal-containing material, such as a metal, formed on the work function tuning layers and filling the space vacated by the removal of the dummy metal gate stack 419. In an example, the capping layer can comprise a first sub-layer on the gate dielectric formed of TiN or the like using ALD, CVD, or the like, and a second sub-layer on the first sub-layer formed of TaN or the like using ALD, CVD, or the like. The work function tuning layer(s) can be formed of TiAl, TiN, or the like using ALD, CVD, or the like. The metal-containing material can be tungsten (W), aluminum (Al), cobalt (Co), ruthenium (Ru), a combination thereof or the like deposited using CVD, physical vapor deposition (PVD), the like, or a combination thereof. As illustrated in FIG. 21C, the metal gate structure 525 fills the space remaining between nanosheets 407 within cavities enclosed by gate dielectrics 521. Next, a planarization process, such as a CMP, may be performed to remove the excess portions of metal gate structure and the gate dielectric, which excess portions are over the top surface of ILDs 513 and 515, resulting in the structure shown in FIGS. 21A and 21B.

FIGS. 22-28B illustrate the formation of three horizontal GAA transistors located near to each other and at a larger distance from each other with modulated gate dielectric thickness and/or composition, sheet thickness, sheet space, sheet width, and stack number relative to each other, in accordance with another embodiment.

Figure 22:
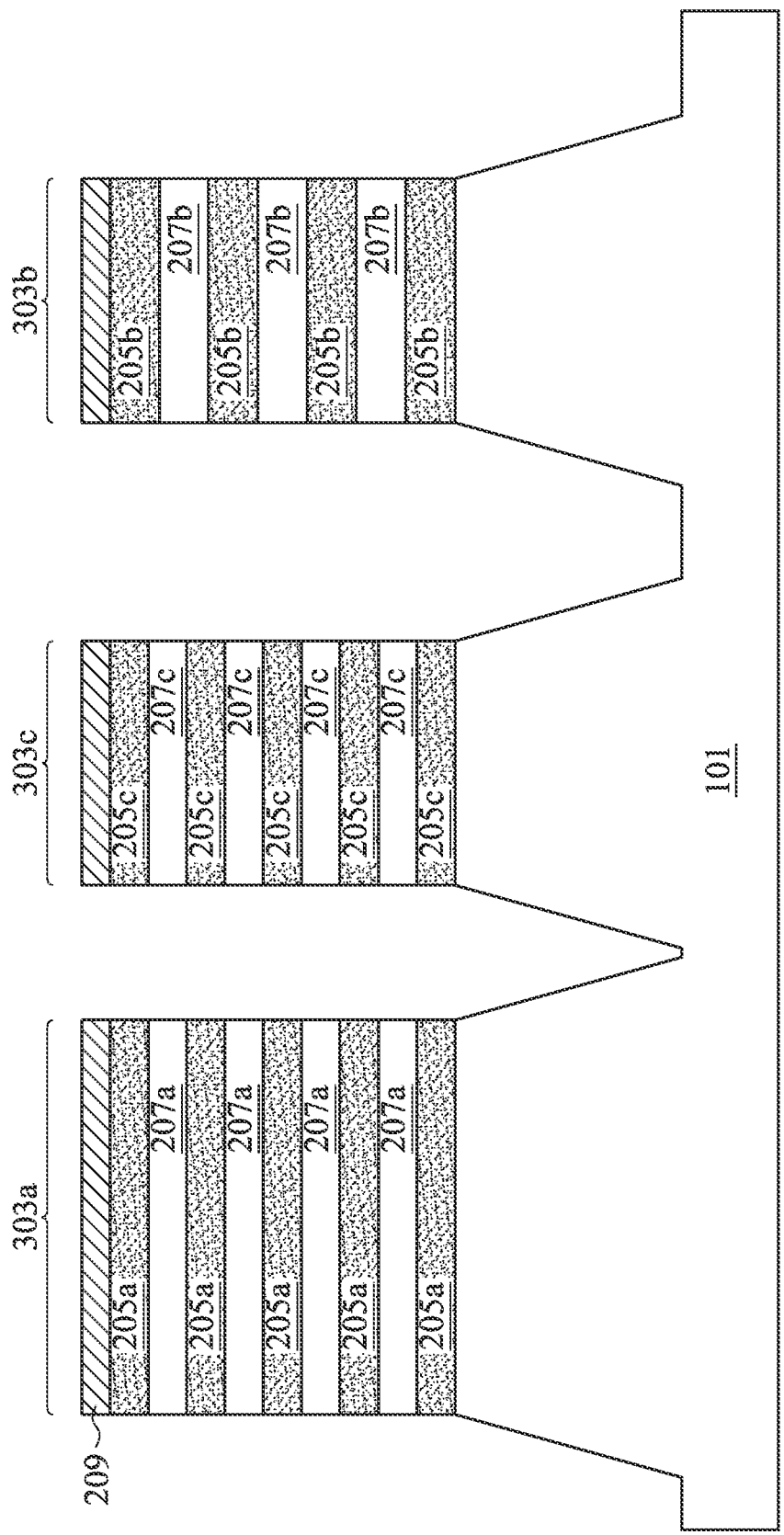
FIGS. 22-28B illustrate various cross-sectional views of intermediate stages of patterning three stacks of alternating layers of semiconductor materials in accordance with some embodiments.

FIG. 22 illustrates an embodiment in which three fins 303a, 303b, and 303c have been patterned from a structure as illustrated in either FIG. 5A or 5B in a cross-sectional view along cross-section B-B, as illustrated in FIG. 2A. The embodiment illustrated in FIG. 22 differs from the embodiment illustrated in FIG. 6B in that first stack of alternating layers 203a has been patterned to form two fins 303a and 303c, respectively. The first and second semiconductor layers 205c and 207c of the third fin 303c may have substantially the same numbers and thicknesses as the first and second semiconductor layers 205a and 207a of the first fin 303a, but fins 303a, 303b, and 303c may be patterned so that fins 303a, 303b, and 303c have different widths. For example, in an embodiment, the width of fin 303a may be between about 4 nm to about 100 nm, the width of fin 303b may be between about 4 nm to about 100 nm, and the width of fin 303c may be between about 4 nm to about 100 nm. The patterning of the fins 303a, 303b, and 303c will determine the widths of the nanosheets (sheet width) produced from the fins in following steps. Larger sheet width (or $W_{eff}$, the NS effective width), can enable higher speed performance. Smaller $W_{eff}$ can enable lower power applications. The fins 303a, 303b, and 303c will be used to form horizontal nanosheets (NSs) for one or more of an n-type FinFET and/or a p-type FinFET. Although three fins (first fin 303a, second fin 303b, and third fin 303c) are shown in FIG. 22, it is to be understood that any suitable number and type of fins 303 may be utilized.

Figure 23:
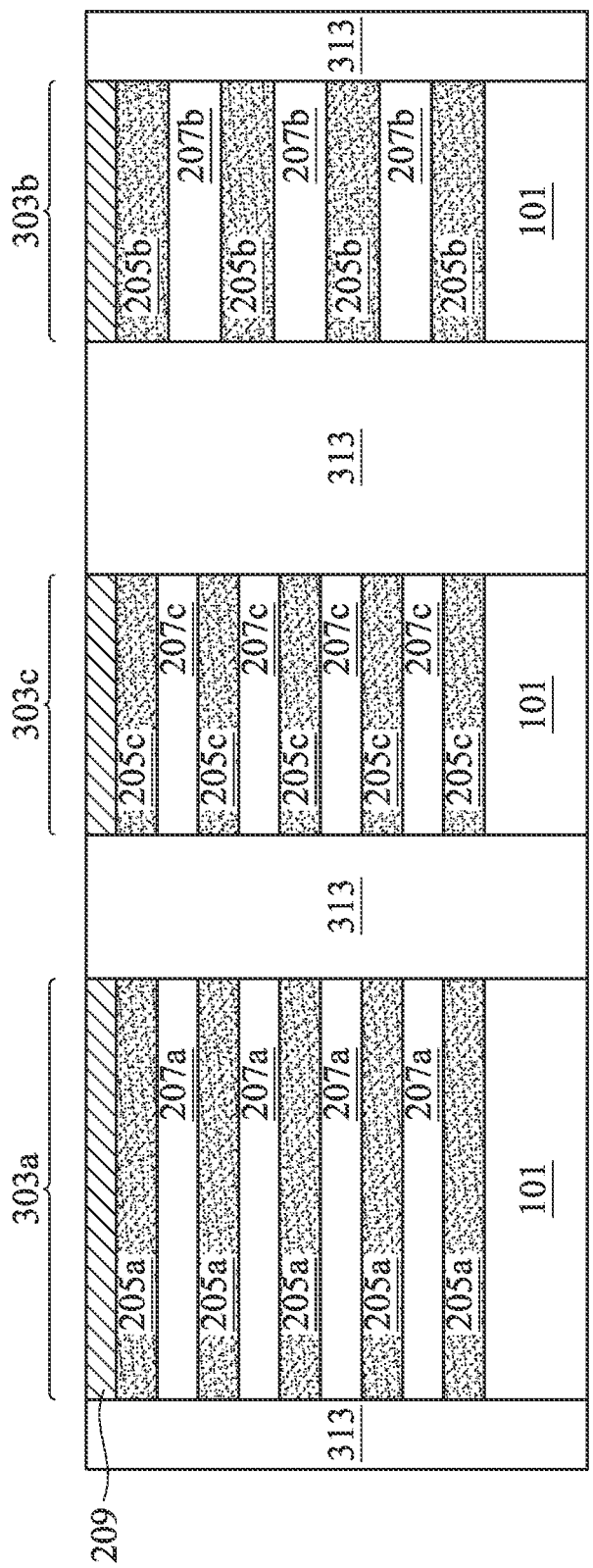
Figure 24:
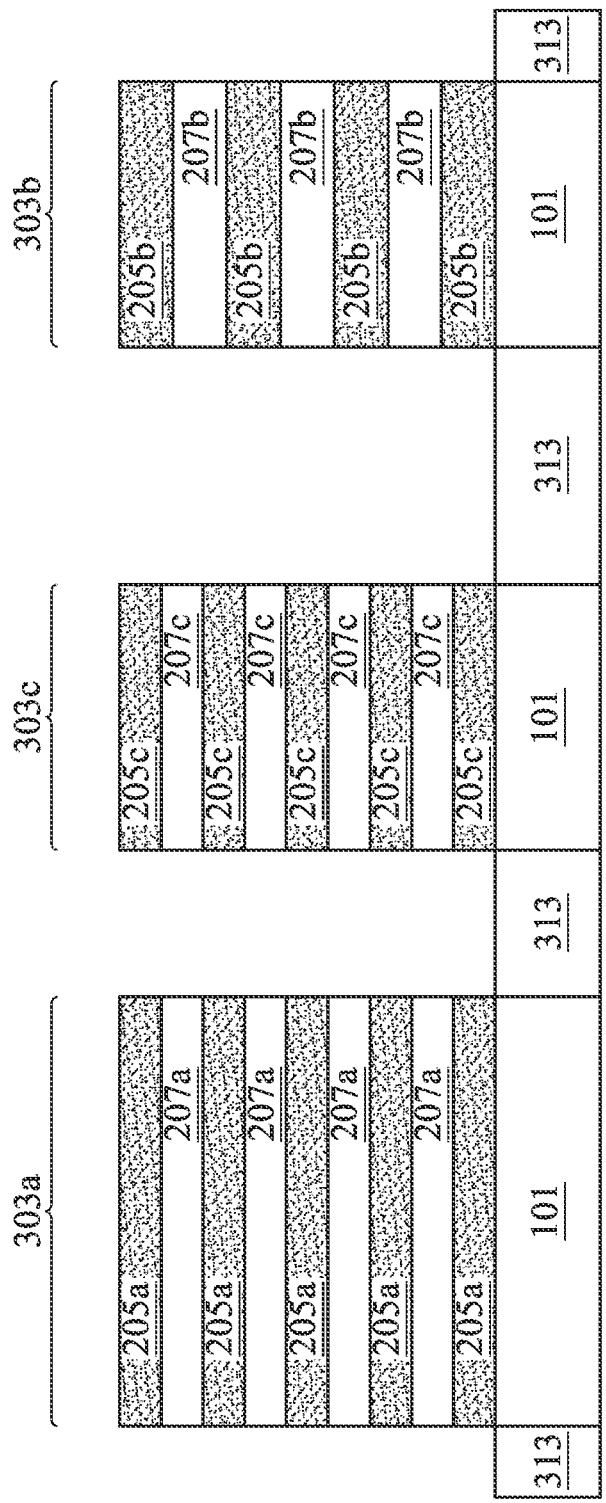
Figure 25:
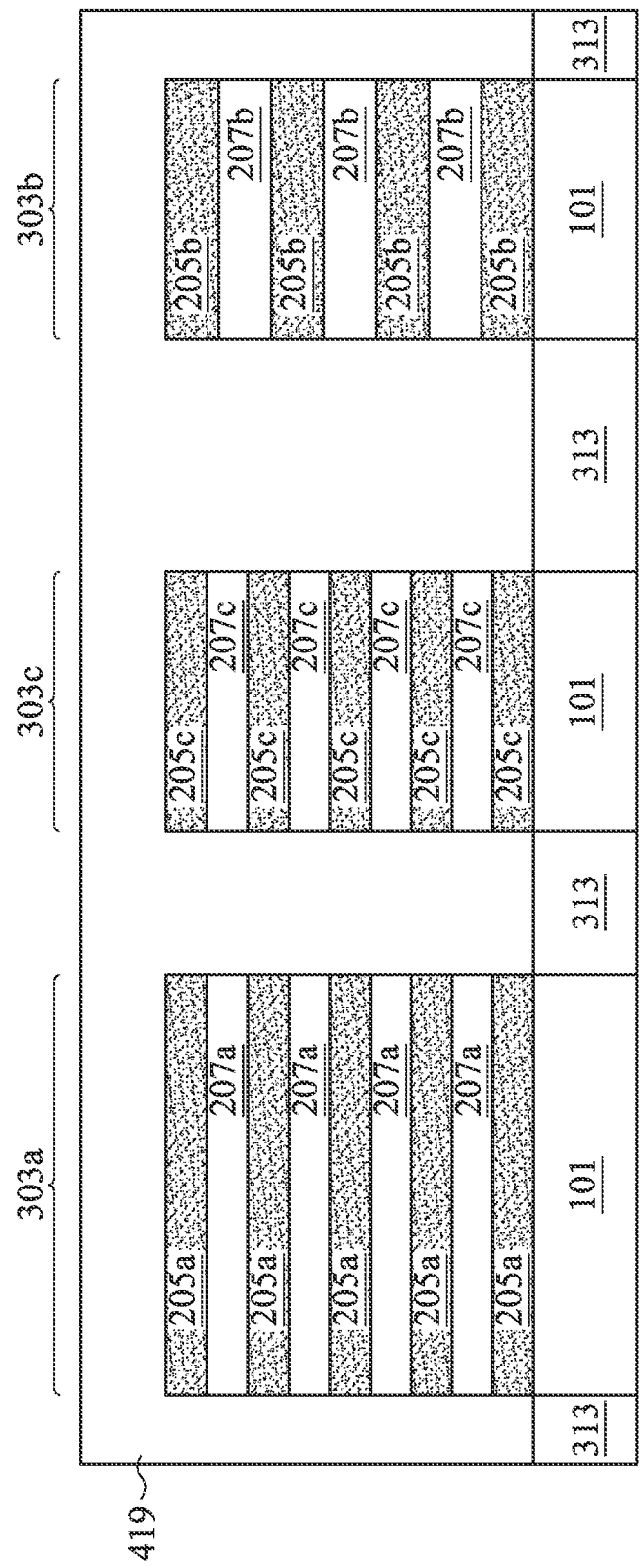
Figure 26:
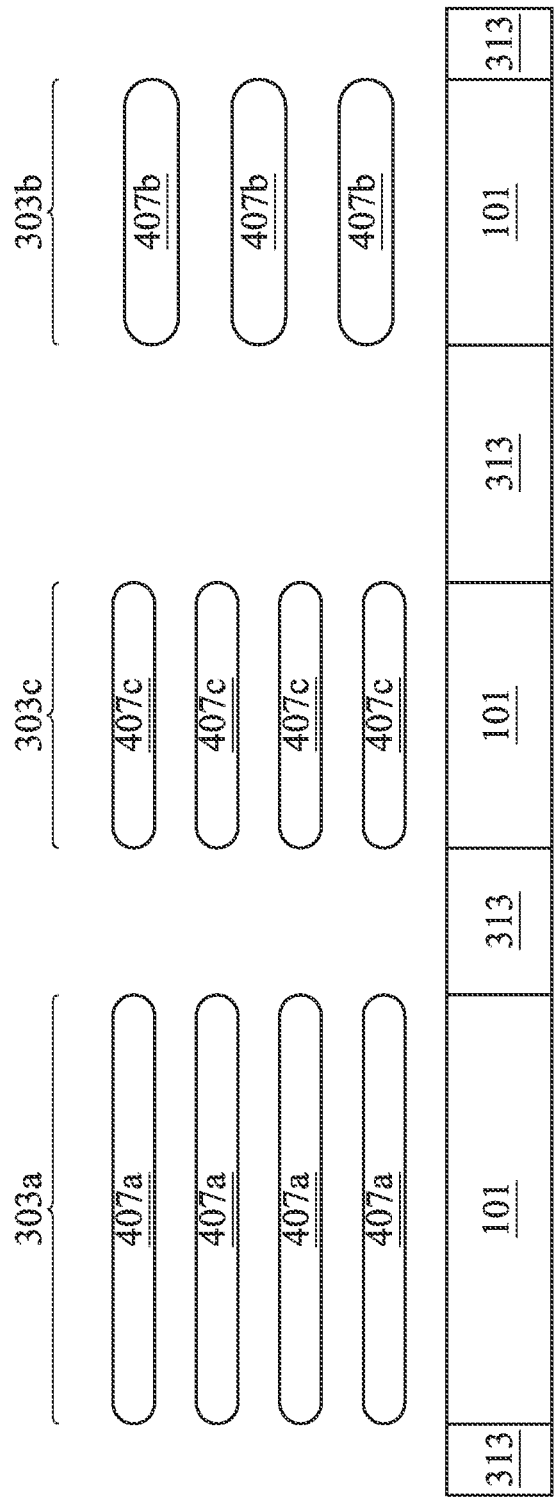

FIG. 23 illustrates the formation of shallow trench isolation regions (STIs) 313 by the procedure illustrated in FIG. 7B above, but with three fins 303 instead of two. FIG. 24 illustrates the recession of the STIs 313 by the procedure illustrated in FIG. 8B above, but with three fins 303 instead of two. FIG. 25 illustrates the formation of a dummy metal gate stack 419 over the first, second, and third fins 303a, 303b, and 303c by the procedure illustrated in FIG. 10B above, but with three fins 303 instead of two. FIG. 26 illustrates the formation of first, second, and third stacks of nanosheets 407a, 407b, and 407c by the procedure illustrated in FIG. 19B above, but with three fins 303 instead of two. It is to be understood that intermediate steps of the procedure illustrated in FIGS. 23-26 are substantially the same as the procedure illustrated above with respect to FIGS. 8B-19B above with three fins 303 instead of two.

Additionally, although three fins (first fin 303a, second fin 303b, and third fin 303c) are shown in FIGS. 23-26, it is to be understood that any suitable number and type of fins may be utilized.

Figure 27:
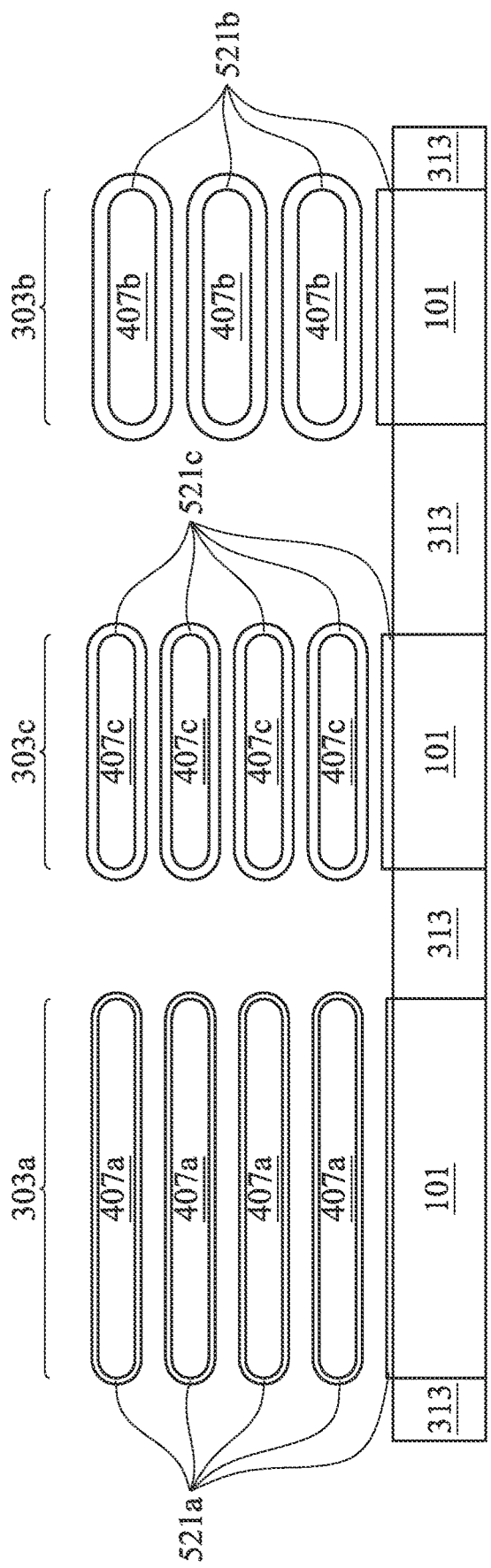

In FIG. 27, a first, second, and third gate dielectric 521a, 521b, and 521c are formed over the exposed portions of the first stack of nanosheets 407a, the second stack of nanosheets 407b, and the third stack of nanosheets 407c, respectively. The first, second, and third gate dielectrics 521a, 521b, and 521c (hence referred to collectively as the gate dielectrics 521) may be interfacial dielectrics. Other embodiments contemplate other materials for the gate dielectrics 521, such as materials that are not high-k.

First, second, and third gate dielectrics 521a, 521b, and 521c may be formed to have different respective thicknesses. Thicker gate dielectrics are useful for IO devices and thinner gate dielectrics are useful for core devices. The relative average thicknesses of the first, second, and third gate dielectrics 521a, 521b, and 521c may be determined by modulating the time length of the periods of deposition for the gate dielectrics. In an embodiment, an average thickness of the first gate dielectric 521a may be between about 1 nm to about 5 nm, an average thickness of the second gate dielectric 521b may be between about 2.5 nm to about 7 nm, and an average thickness of the third gate dielectric 521c may be between about 1 nm to about 7 nm. In an embodiment, the average thickness of the third gate dielectric 521c is substantially greater than the average thickness of the first gate dielectric 521a and substantially smaller than the average thickness of the second gate dielectric 521b in order to use the third gate dielectric 521c as part of a device with enhanced reliability using lower power.

First, second, and third gate dielectrics 521a, 521b, and 521c may also be formed to have different compositions. For example, the first gate dielectric 521a may comprise $SiO_2$, SiON, $Si_3N_4$, $HfO_x$, $LaO_x$, and/or $AlO_x$, and the second gate dielectric 521b and the third gate dielectric 521c may comprise varied ratios of $SiO_2$, SiON, $Si_3N_4$, $HfO_x$, $LaO_x$, and/or $AlO_x$ from the first gate dielectric 521a.

Figure 28A:
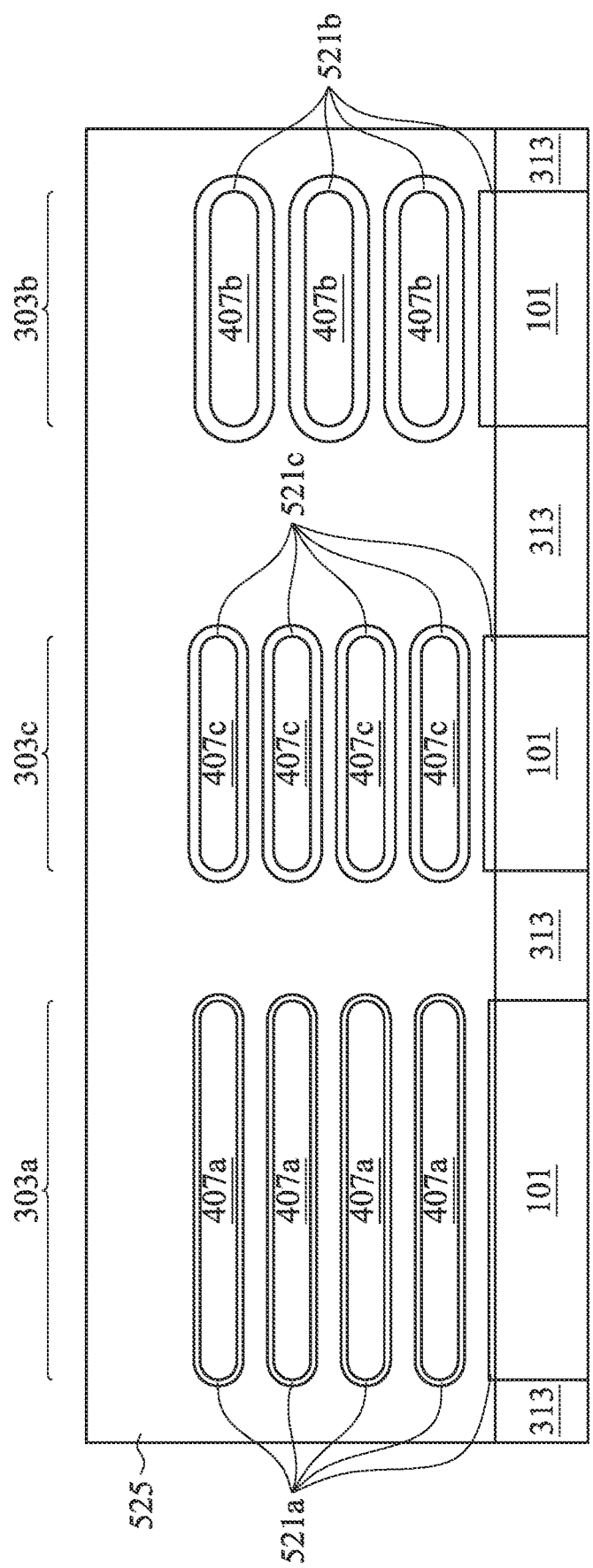
Figure 28B:
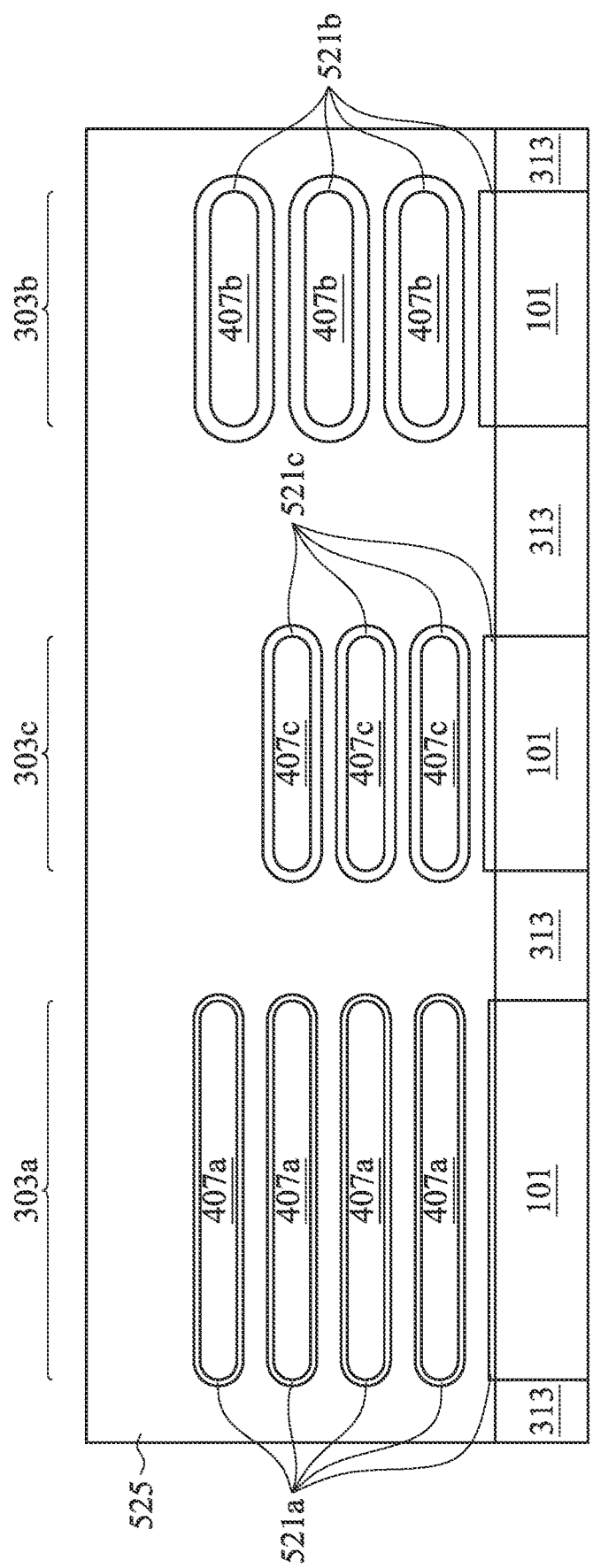

In FIG. 28A, a metal gate structure 525 is formed on the gate dielectrics 521 by the procedure illustrated in FIG. 10B above, but with three fins 303 instead of two. FIG. 28B illustrates another embodiment, in which a top nanosheet 407c has been removed, resulting in a third stack of nanosheets 407c with fewer nanosheets than the first stack of nanosheets 407a. In other embodiments, different numbers of nanosheets may be removed from first, second, and third stacks of nanosheets 407a, 407b, and 407c. It is to be understood that nanosheets can be removed at any convenient step in the fabrication process. For example, the top nanosheet 407c could be removed by an appropriate Si selective removal process after the formation of the third stack of nanosheets illustrated in FIG. 26. Reduction in the stack number of the third stack of nanosheets 407c may allow for use as part of a device requiring less power with greater reliability. Additionally, although three stacks of nanosheets 407a, 407b, and 407c are shown in the structures illustrated in FIGS. 28A and 28B, it is to be understood that any suitable number of stacks of nanosheets may be produced.

The embodiments disclosed above include methods for fabrication of GAA transistors that allow for the modulation of nanosheet (NS) width, NS thickness, NS space, and stack number. This modulation of NS structures can be employed on single wafers. This design flexibility provides for design optimization over a wide tuning range of circuit performance and power usage. Larger NS width can enable higher speed performance and smaller NS width and/or stack number reduction can enable lower power applications. Increasing sheet space, the distance between adjacent nanosheets in a stack, enables the use of thicker IO gate oxide which can be used for fulfilling NS structure input-output (IO) devices. GAA transistor devices using the NS structures can be fabricated nearby each other or far away from each other, and can be used for logic devices, static random access memory (SRAM) devices, IO devices, electro-static discharge (ESD) devices, or passive devices.

In accordance with an embodiment, a method of manufacturing a device includes: forming a first stack of alternating layers on a substrate, wherein forming the first stack of alternating layers includes depositing alternating first layers of a first semiconductor material and second layers of a second semiconductor material different from the first semiconductor material on the substrate; forming a second stack of alternating layers on the substrate at a first distance from the first stack of alternating layers, wherein forming the second stack of alternating layers includes depositing alternating first layers of the first semiconductor material and second layers of the second semiconductor material on the substrate, wherein the first layers of the second stack of alternating layers have a thickness greater than the first layers of the first stack of alternating layers; constructing a first stack of nanosheets from the first stack of alternating layers and a second stack of nano sheets from the second stack of alternating layers, wherein the constructing the first and second stack of nanosheets includes: patterning a first fin from the first stack of alternating layers and a second fin from the second stack of alternating layers; and removing the first layers from the first stack of alternating layers and removing the first layers from the second stack of alternating layers, such that the distances between adjacent remaining layers of the second stack of alternating layers are greater than the distances between adjacent remaining layers of the first stack of alternating layers; and forming a first gate dielectric over the first stack of nanosheets and a second gate dielectric over the second stack of nanosheets. In an embodiment, the first gate dielectric is formed to include a first gate dielectric thickness and the second gate dielectric is formed to include a second gate dielectric thickness greater than the first gate dielectric thickness. In an embodiment, the first and second gate dielectrics are formed to include different materials. In an embodiment, the first stack of alternating layers is formed to include a first number of alternating layers by controlling the number of cycles of epitaxial growth used to form the first stack of alternating layers, wherein the second stack of alternating layers is formed to include a second number of alternating layers by controlling the number of cycles of epitaxial growth used to form the second stack of alternating layers, and wherein the first number is different from the second number. In an embodiment, the second layers of the second stack of alternating layers are formed to have a thickness greater than the second layers of the first stack of alternating layers.

In accordance with another embodiment, a method of manufacturing a device includes: etching a recess in a first stack of alternating layers, wherein the first stack of alternating layers includes alternating first layers including a first semiconductor material and second layers including a second semiconductor material different from the first semiconductor material on a substrate, wherein the first layers of the first stack of alternating layers have a first average thickness and the second layers of the first stack of alternating layers have a second average thickness, wherein the first average thickness and the second average thickness are determined by controlling epitaxial growth of the first and second layers of the first stack of alternating layers; forming a second stack of alternating layers within the first stack of alternating layers, wherein the forming the second stack of alternating layers includes depositing alternating first layers including the first semiconductor material and second layers including the second semiconductor material in the recess, wherein the first layers of the second stack of alternating layers have a third average thickness and the second layers of the second stack of alternating layers have a fourth average thickness, wherein the third average thickness is different from the first average thickness and wherein the fourth average thickness is different from the second average thickness, wherein the third average thickness and the fourth average thickness are determined by controlling epitaxial growth of the first and second layers of the second stack of alternating layers; constructing a first stack of nanosheets from the first stack of alternating layers and a second stack of nanosheets from the second stack of alternating layers, wherein constructing the first and second stack of nanosheets includes: patterning a first fin from the first stack of alternating layers and a second fin from the second stack of alternating layers; removing one out of the first layers and the second layers from the first stack of alternating layers and the second stack of alternating layers; and forming a first gate dielectric over the first stack of nanosheets and a second gate dielectric over the second stack of nanosheets. In an embodiment, the first stack of nanosheets is formed to have a first width, the second stack of nanosheets is formed to have a second width, and the first width is different from the second width. In an embodiment, the first and second stacks of nanosheets are formed to include different numbers of nanosheets. In an embodiment, forming the second stack of alternating layers further includes: forming a spacer on sidewalls of the recess; and depositing alternating first layers of the first semiconductor material and second layers of the second semiconductor material in the recess between sidewalls of the spacer. In an embodiment, patterning the second fin includes etching away the spacer. In an embodiment, forming a second stack of alternating layers further includes depositing alternating first layers of the first semiconductor material and second layers of the second semiconductor material conformally on a bottom and sidewalls of the recess. In an embodiment, patterning the second fin includes etching away an outer portion of the second stack of alternating layers such that the remaining portion includes only alternating horizontal first layers of the first semiconductor material and horizontal second layers of the second semiconductor material.

In accordance with yet another embodiment, a device includes: a first stack of nanosheets, wherein each nanosheet of the first stack of nanosheets is surrounded by a first gate dielectric, wherein adjacent nanosheets of the first stack of nanosheets are separated by a first average spacing; and a second stack of nanosheets located at a first distance from the first stack of nanosheets, wherein each nanosheet of the second stack of nanosheets is surrounded by a second gate dielectric, wherein adjacent nanosheets of the second stack of nanosheets are separated by a second average spacing, wherein the second average spacing is greater than the first average spacing. In an embodiment, the first gate dielectric has a first average thickness, the second gate dielectric has a second average thickness, and the second average thickness is greater than the first average thickness. In an embodiment, the first and second stacks of nanosheets include different numbers of nanosheets. In an embodiment, the nanosheets of the first stack of nanosheets have a first average thickness, the nanosheets of the second stack of nanosheets have a second average thickness, and the second average thickness is greater than the first average thickness. In an embodiment, the first stack of nanosheets includes part of a logic device and wherein the second stack of nanosheets includes part of an IO device. In an embodiment, a third stack of nanosheets is located at a second distance from the first stack of nanosheets such that the second distance is less than the first distance, and wherein the first stack of nanosheets has a first width and wherein the third stack of nanosheets has a second width, such that the first width is greater than the second width. In an embodiment, a third stack of nanosheets is located at a second distance from the first stack of nanosheets such that the second distance is less than the first distance, wherein each nanosheet of the third stack of nanosheets is surrounded by a third gate dielectric, wherein the first gate dielectric has a first average thickness, wherein the second gate dielectric has a second average thickness, and wherein the third gate dielectric has a third average thickness, such that the third average thickness is greater than the first average thickness and such that the third average thickness is less than the second average thickness. In an embodiment, a third stack of nanosheets is located at a second distance from the first stack of nanosheets such that the second distance is less than the first distance, and wherein the first and third stacks of nanosheets include different numbers of nanosheets.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
   a substrate;
   a first stack of nanosheets located above the substrate, wherein each nanosheet of the first stack of nanosheets is surrounded by a first gate dielectric, wherein adjacent nanosheets of the first stack of nanosheets are separated by a first average spacing;
   a second stack of nanosheets located above the substrate and located at a first distance from the first stack of nanosheets, wherein each nanosheet of the second stack of nanosheets is surrounded by a second gate dielectric, wherein adjacent nanosheets of the second stack of nanosheets are separated by a second average spacing, wherein the second average spacing is greater than the first average spacing, the first stack of nanosheets and the second stack of nanosheets being separated one from the other by a dielectric-filled trench in the topmost surface of the substrate, the dielectric-filled trench having a longitudinal axis parallel to a longitudinal axis of the first stack of nanosheets; and
   a third stack of nanosheets located above the substrate, the third stack of nanosheets located at a second distance from the first stack of nanosheets such that the second distance is less than the first distance, wherein each nanosheet of the third stack of nanosheets is surrounded by a third gate dielectric, wherein the first gate dielectric has a first average thickness, wherein the second gate dielectric has a second average thickness, and wherein the third gate dielectric has a third average thickness, such that the third average thickness is greater than the first average thickness and such that the third average thickness is less than the second average thickness.

2. The device of claim 1, wherein the substrate comprises a protruding portion, and wherein the first stack of nanosheets is directly on the protruding portion.

3. The device of claim 1, wherein the nanosheets of the first stack of nanosheets have a first average thickness, wherein the nanosheets of the second stack of nanosheets have a second average thickness, and wherein the second average thickness is greater than the first average thickness.

4. The device of claim 1, wherein the first stack of nanosheets comprises part of a logic device and wherein the second stack of nanosheets comprises part of an TO device.

5. The device of claim 1, wherein a third stack of nanosheets is located at a second distance from the first stack of nanosheets such that the second distance is less than the first distance, and wherein the first stack of nanosheets has a first width and wherein the third stack of nanosheets has a second width, such that the first width is greater than the second width.

6. The device of claim 1, wherein a third stack of nanosheets is located at a second distance from the first stack of nanosheets such that the second distance is less than the first distance, and wherein the first and third stacks of nanosheets comprise different numbers of nanosheets.

7. A device, comprising:
a substrate having a planar top surface;
a first fin structure formed on the topmost surface, the first fin structure comprising
a first fin extension of the substrate, the first fin extension extending above the planar top surface of the substrate,
a first stack of nanosheets directly above the first fin extension, wherein each nanosheet of the first stack of nanosheets is surrounded by a first gate dielectric, wherein adjacent nanosheets of the first stack of nanosheets are separated by a first average spacing, and
first source/drain regions on respective ends of the first fin structure, the respective first source/drain regions extending below the topmost surface of the substrate; and
a second fin structure formed on the topmost surface, the second fin structure comprising
a second fin extension of the substrate, the second fin extension extending above the top surface of the substrate,
a second stack of nanosheets directly on the second fin extension and located at a first distance from the first stack of nanosheets, wherein each nanosheet of the second stack of nanosheets is surrounded by a second gate dielectric, wherein adjacent nanosheets of the second stack of nanosheets are separated by a second average spacing, wherein the second average spacing is greater than the first average spacing,
second source/drain regions on respective ends of the second fin structure, the respective second source/drain regions extending below the topmost surface of the substrate; and
the first fin extension and the second fin extension being separated one from the other by a dielectric layer, the dielectric layer extending to the planar surface of the substrate, wherein the first stack of nanosheets and the second stack of nanosheets are above a topmost surface of the dielectric layer;
a third fin structure formed on the topmost surface, the third fin structure comprising
a third fin extension of the substrate, the third extension extending above the planar top surface of the substrate,
a third stack of nanosheets directly on the third fin extension, wherein each nanosheet of the third stack of nanosheets is surrounded by a third gate dielectric, wherein adjacent nanosheets of the third stack of nanosheets are separated by a third average spacing, and
third source/drain regions on respective ends of the third fin structure, the respective third source/drain regions extending below the topmost surface of the substrate;
wherein an average thickness of the third gate dielectric is greater than an average thickness of the first gate dielectric and is lesser than the an average thickness of the second gate dielectric; and
wherein a distance from the first fin extension to the third fin extension is lesser than a distance from the first fin extension to the second fin extension.

8. The device of claim 7, further comprising a common gate electrode extending over the first stack of nanosheets and the second stack of nanosheets.

9. The device of claim 7, wherein the first gate dielectric has a first average thickness, the second gate dielectric has a second average thickness, and the second average thickness is greater than the first average thickness.

10. The device of claim 7, wherein the first and second stacks of nanosheets comprise different numbers of nanosheets.

11. The device of claim 7, wherein the nanosheets of the first stack of nanosheets have a first average thickness, wherein the nanosheets of the second stack of nanosheets have a second average thickness, and wherein the second average thickness is greater than the first average thickness.

12. The device of claim 7, wherein a third stack of nanosheets is located at a second distance from the first stack of nanosheets such that the second distance is less than the first distance, and wherein the first stack of nanosheets has a first width and wherein the third stack of nanosheets has a second width, such that the first width is greater than the second width.

13. The device of claim 7, further comprising a common metal gate electrode extending over the first, second, and third nanosheets.

14. A device, comprising:
a first stack of nanosheets extending from and directly over a first fin structure, the first fin structure protruding from a major surface of a semiconductor substrate, wherein each nanosheet of the first stack of nanosheets is surrounded by a first gate dielectric, wherein adjacent nanosheets of the first stack of nanosheets are separated by a first average spacing, and wherein the first gate dielectric has a first average thickness;
a second stack of nanosheets located at a first distance from the first stack of nanosheets and extending from and directly on a second fin structure, the second fin structure protruding from the major surface of the semiconductor substrate, wherein each nanosheet of the second stack of nanosheets is surrounded by a second gate dielectric, wherein adjacent nanosheets of the second stack of nanosheets are separated by a second average spacing, wherein the second average spacing is greater than the first average spacing, and wherein the second gate dielectric has a second average thickness; and a third stack of nanosheets located at a second distance from the first stack of nanosheets such that the second distance is less than the first distance, and wherein the first stack of nanosheets has a first width and wherein the third stack of nanosheets has a second width, such that the first width is greater than the second width, wherein each nanosheet of the third stack of nanosheets is surrounded by a third gate dielectric, and wherein the third gate dielectric has a third average thickness, the third average thickness being greater than the first average thickness and less than the second average thickness.

15. The device of claim 14, wherein the first gate dielectric has a first average thickness, the second gate dielectric has a second average thickness, and the second average thickness is greater than the first average thickness.

16. The device of claim 14, wherein the first and second stacks of nanosheets comprise different numbers of nanosheets.

17. The device of claim 14, wherein the nanosheets of the first stack of nanosheets have a first average thickness, wherein the nanosheets of the second stack of nanosheets have a second average thickness, and wherein the second average thickness is greater than the first average thickness.

18. The device of claim 14, wherein a third stack of nanosheets is located at a second distance from the first stack of nanosheets such that the second distance is less than the first distance, and wherein the first stack of nanosheets has a first width and wherein the third stack of nanosheets has a second width, such that the first width is greater than the second width.

* * * * *